(12) United States Patent
Kanzaki et al.

(10) Patent No.: US 7,193,928 B2
(45) Date of Patent: Mar. 20, 2007

(54) SIGNAL OUTPUT DEVICE AND METHOD FOR THE SAME

(75) Inventors: Hideyuki Kanzaki, Takarazuka (JP); Masaaki Harada, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 86 days.

(21) Appl. No.: 11/194,287

(22) Filed: Aug. 1, 2005

(65) Prior Publication Data

US 2006/0023564 A1    Feb. 2, 2006

(30) Foreign Application Priority Data

Aug. 2, 2004    (JP)    ............... 2004-225350

(51) Int. Cl.
*G11C 8/00*    (2006.01)
(52) U.S. Cl. .................. 365/233; 365/230.09
(58) Field of Classification Search ................ 365/233, 365/230.08, 189.04
See application file for complete search history.

(56) References Cited

U.S. PATENT DOCUMENTS

| 6,094,380 | A  | * | 7/2000 | Kim ........................... 365/194 |
| 6,192,004 | B1 | * | 2/2001 | Aikawa et al. ............. 365/233 |
| 2004/0095838 | A1 | * | 5/2004 | Li ............................. 365/233 |

FOREIGN PATENT DOCUMENTS

JP    08-314764    11/1996
JP    2001-142733    5/2001

* cited by examiner

*Primary Examiner*—Anh Phung

(57) ABSTRACT

A signal output device includes a first selection unit operable to select a plurality of signal lines from a signal line group, a second selection unit operable to select a reference clock of signals carried by the selected signal lines, a determination unit operable to determine an output clock based on the reference clock and the number of selected signal lines, and an output control unit operable to sample the signals carried by the selected signal lines on every cycle of the reference clock and to sequentially output the sampled signals on every cycle of the output clock.

10 Claims, 19 Drawing Sheets

FIG. 18
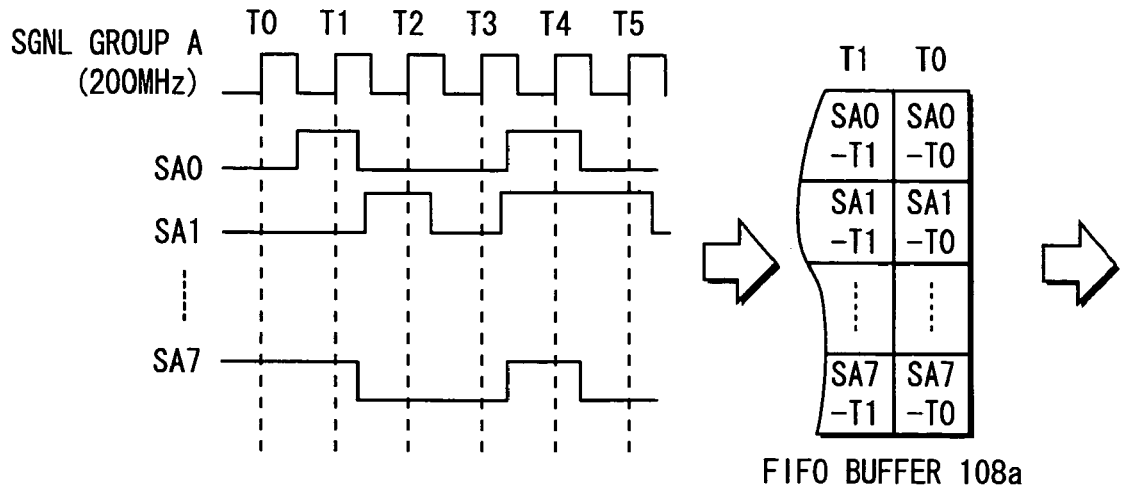
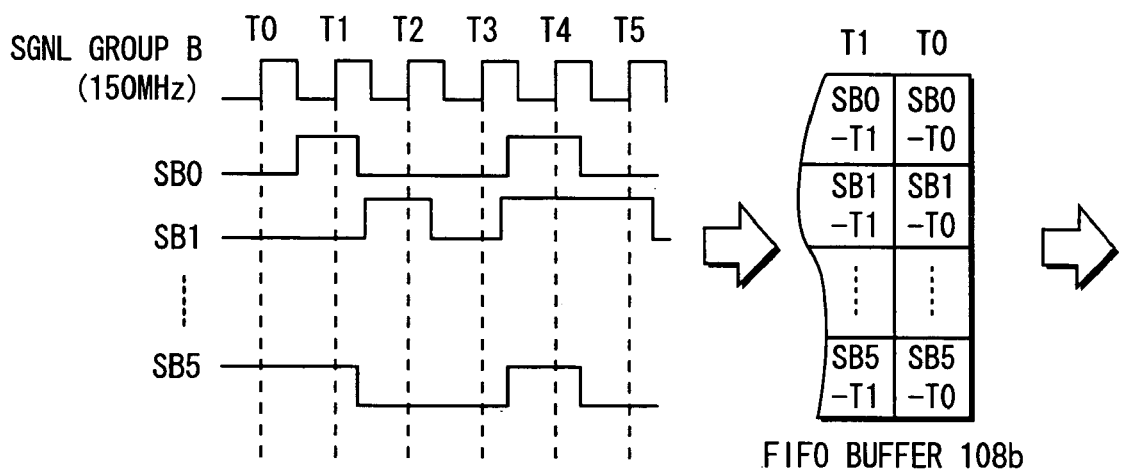
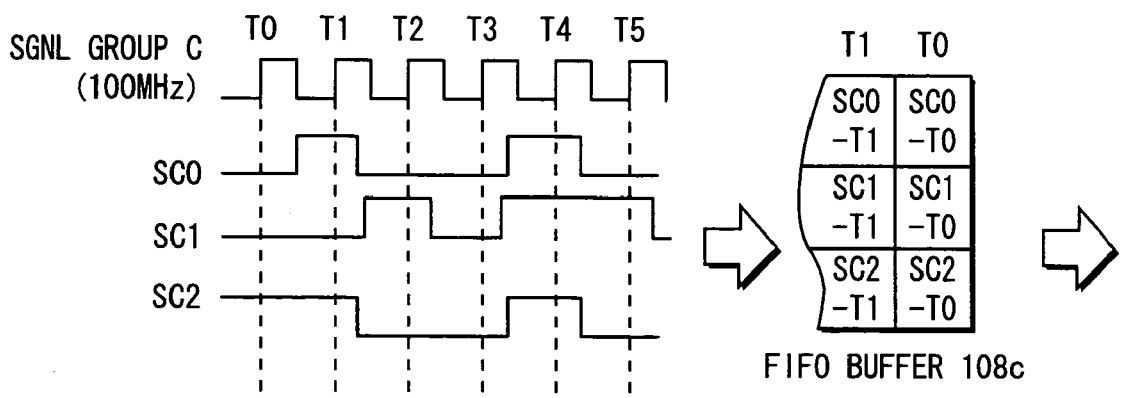

SIGNAL OUTPUT DEVICE AND METHOD FOR THE SAME

BACKGROUND OF INVENTION

1. Field of the Invention

The present invention relates to a signal output device and a method for the same, and in particular to signal output technology effective in the development/debugging and performance evaluation of integrated circuits such as system LSIs.

2. Related Art

Recent years have seen advances in the high functionality and high integration of LSIs (large-scale integration). Example of highly integrated LSIs include system LSIs integrating a large number of functions on a single chip, and also SoCs (system-on-chip) integrating the main functions of a computer such as the microprocessor, chip set, video chip and memory on a single chip.

These LSIs each include a great many signal lines (buses etc.) connecting the various functional blocks, with signals carried by the signal lines being output via one or more output terminals to an external device for evaluation of LSI performance. In recent years, the advent of signal lines carrying multi-bit signals and the multilayering of signal lines has lead to an increase in the number of signal lines, making it increasingly necessary to observe multi-bit signals obtained on one reference clock (RCLK) cycle using limited output terminals.

A conventional technique for observing signals carried by the signal lines of an LSI involves sampling signals operating at a prescribed RCLK and storing the sampled data in a bus trace memory, before later outputting the stored data via external output terminals for analysis at a prescribed clock frequency (Japanese Patent Application Publication No. 8-314764).

According to this conventional technique, the number of output terminals is usually fixed rather than being dynamic, meaning that the clock frequency at which stored data is output to the output terminals is also fixed. Initially storing sampled data in memory for later reading and analysis is thus unavoidable in order to perform equal and accurate analysis of signals operating at a higher RCLK than the output clock (OCLK) or signals carried by a greater number of signal lines than there are output terminals. Overflows occur if not performed in this way because of the analysis speed of the external device (i.e. OCLK) not being able to keep up with the input speed of the signals (i.e. RCLK) due to the higher RCLK or the greater number of signal lines than output terminals.

With this conventional technique, real-time signal analysis via external output terminals is impossible since signals cannot be input/output in real-time, making it difficult to observe signal errors in real-time.

In view of this, an object of the present invention is to provide a signal output device and a method for the same that enable signals carried by a plurality of signal lines operating at a prescribed RCLK to be observed in real-time by an external device via one or more output terminals.

SUMMARY OF INVENTION

To resolve the above problems, a signal-output device of the present invention includes a first selection unit operable to select a plurality of signal lines from a signal line group, a second selection unit operable to select a reference clock of signals carried by the selected signal lines, a determination unit operable to determine an output clock based on the reference clock and the number of selected signal lines, and, an output control unit operable to sample the signals carried by the selected signal lines on every cycle of the reference clock, and to sequentially output the sampled signals on every cycle of the output clock.

According to this structure, an optimum OCLK is determined dynamically based on the number of signal lines targeted for observation and an RCLK of signals carried by the these signal lines, and signals are output sequentially on every cycle of this optimum OCLK, making it possible to observe signals operating at the RCLK in real time at an external device without initially storing the signals in a bus trace memory or similar storage unit.

Desirably, the signal output device is implemented in an IC package that includes the signal line group, which connects a plurality of circuits, and one or more observatory output terminals via which the sampled signals are output for observation, wherein the determination unit determines the output clock based further on the number of observatory output terminals, and the output control unit outputs the sampled signals via the one or more observatory output terminals on every cycle of the output clock so as to be dispersed over the one or more observatory output terminals.

This structure enables signals carried by the signal lines of IC packages such as system LSIs (e.g. SoCs) to be observed in real time from outside the package via specified external terminals.

Desirably, for the signal output device, the determination unit determines the output clock so that signals sampled on one cycle of the reference clock are shaped to be output within a period equivalent to the one cycle.

This structure ensures that signals targeted for observation are always output via the observation output terminals in real time.

Desirably, for the signal output device, the determination unit determines a frequency f satisfying an expression $N*F \leq M*f$ as the output clock, where N is the number of selected signal lines, F is the reference clock, and M is the number of observatory output terminals.

According to this structure, the optimum OCLK is determined with consideration given also to the number of observatory output terminals, making the signal output device applicable in a variety of IC packages provided with different numbers of observatory output terminals.

For example, if the user wants to observe four signal lines operating at a 200 MHz RCLK there are two observatory output terminals and, signals should be output to the output terminals at 400 MHz or greater. For example, if there are two observatory output terminals and the user wants to observe four signal lines carrying signals operating at a 200 MHz RCLK, signals should be output to the output terminals at 400 MHz or greater.

Desirably, the signal output device further includes an output unit operable, when signals are output at the output clock, to generate a cycle boundary signal showing a boundary between periods in which the output control unit outputs signals sampled on one cycle of the reference clock and signals sampled on the next cycle, and to output the cycle boundary signal via an output terminal other than the one or more observatory output terminals.

This structure enables the user to be aware of the start position of every cycle of the RCLK at which signals were sampled when observing signals output via the observatory output terminals at the OCLK. The user is thus able to grasp which RCLK cycle the signals being observed belong to.

Desirably, the signal output device further includes an output unit operable, when signals are output at the output clock, to perform padding by generating a dummy signal and outputting the dummy signal to any observatory output terminal via which a signal will not be output during a period in which the output control unit outputs signals sampled on one cycle of the reference clock, and to output via an output terminal other than the one or more observatory output terminals padding ID signals that show the number of dummy signals output on every cycle of the output clock and identify observatory output terminals via which dummy signals are output.

This structure makes it easier to observe signals output via the observatory output terminals. That is, even if the number of signal lines and the number of observatory output terminals are not integer multiples of one another, signals sampled in one cycle of the RCLK are shaped by outputting dummy signals as extra signals to enable the sampled signals to be output within a period equivalent to the one cycle.

Furthermore, the observation of signals output via the observatory output terminals is facilitated given that the user can be aware of dummy signal output when observing signals output via the observatory output terminals at the OCLK.

Desirably, for the signal output device, the first selection unit selects a plurality of signal lines carrying signals operating at different reference clocks from the signal line group, the second selection unit selects the different reference clocks of the signals carried by the selected signal lines, the determination unit determines the output clock based on the fastest of the reference clocks and the number of selected signal lines, and the output control unit samples the signals carried by the selected signal lines at the respective reference clocks, and sequentially outputs the sampled signals on every cycle of the output clock.

According to this structure, even if a plurality of signal lines operating at different RCLKs are chosen for sequential observation, signals carried by all the signal lines can be observed in real time given that signals sampled on one cycle of the respective RCLKs can be output within a period equivalent to the one cycle.

Desirably, the signal output device further includes an output unit operable, when signals are output at the output clock, to generate a clock boundary signal showing a boundary between cycle periods in which the signals sampled at the respective reference clocks are output, and to output the clock boundary signal via an output terminal other than the one or more observatory output terminals.

In the case of a plurality of signal lines operating at different RCLKs being chosen for sequential observation, this structure enables the user to be aware of the start position of signals operating at the respective RCLKs when observing signals output via the observatory output terminals at the OCLK. The user is thus able to grasp which RCLK cycle the signals being observed belong to.

Desirably, the signal output device further includes an output unit operable, when signals are output at the output clock, to perform padding by generating a dummy signal and outputting the dummy signal to any observatory output terminal via which a signal will not be output during a period in which the output control unit outputs signals sampled at one of the plurality of reference clocks, and to output via an output terminal other than the one or more observatory output terminals padding ID signals that show the number of dummy signals output on every cycle of the output clock and identify observatory output terminals via which dummy signals are output.

This structure makes it easier to observe signals output via the observatory output terminals. That is, even if the number of signal lines and the number of observatory output terminals are not integer multiples of one another, signals sampled in one cycle of the respective RCLKs are shaped by outputting dummy signals as extra signals to enable the sampled signals to be output within a period equivalent to the one cycle.

Furthermore, the observation of signals output via the observatory output terminals is facilitated given that the user can be aware of dummy signal output when observing signals output via the observatory output terminals at the OCLK.

To resolve the above problems, furthermore, a signal output method of the present invention includes the steps of selecting a plurality of signal lines from a signal line group, selecting a reference clock of signals carried by the selected signal lines, determining an output clock based on the reference clock and the number of selected signal lines; and sampling the signals carried by the selected signal lines at the reference clock, and sequentially outputting the sampled signals on every cycle of the output clock.

According to this structure, an optimum OCLK is determined dynamically based on the number of signal lines targeted for observation and the RCLK of signals carried by the these signal lines, and signals are output sequentially on every cycle of this optimum OCLK, making it possible to observe signals operating at the RCLK in real time at an external device without initially storing the signals in a bus trace memory or similar storage unit.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings:

FIG. 18 is a schematic diagram of a signal output operation performed by signal output device 200.

DETAILED DESCRIPTION OF PREFERRED EMBODIMENTS

Embodiments of the present invention are described below with reference-to the drawings.

Embodiment 1

1. Structure

The structure of a signal output device 100 pertaining to embodiment 1 of the present invention is described firstly.

Signal output device 100 is implemented in an integrated circuit (IC) package (SoC etc.), and by being connected to signal lines linking other devices (microprocessor, memory etc.) provided in the IC package, outputs signals carried by these signal lines to an external device via observatory output terminals provided in the IC package. Observatory output terminals are output terminals for connecting to an external observation device (bus monitor etc.) in order to observe signals from outside the IC package.

Note that the number of signal lines in signal output device 100 is assumed to be n, and the number of observatory output terminals is assumed to be M.

Figure 1:
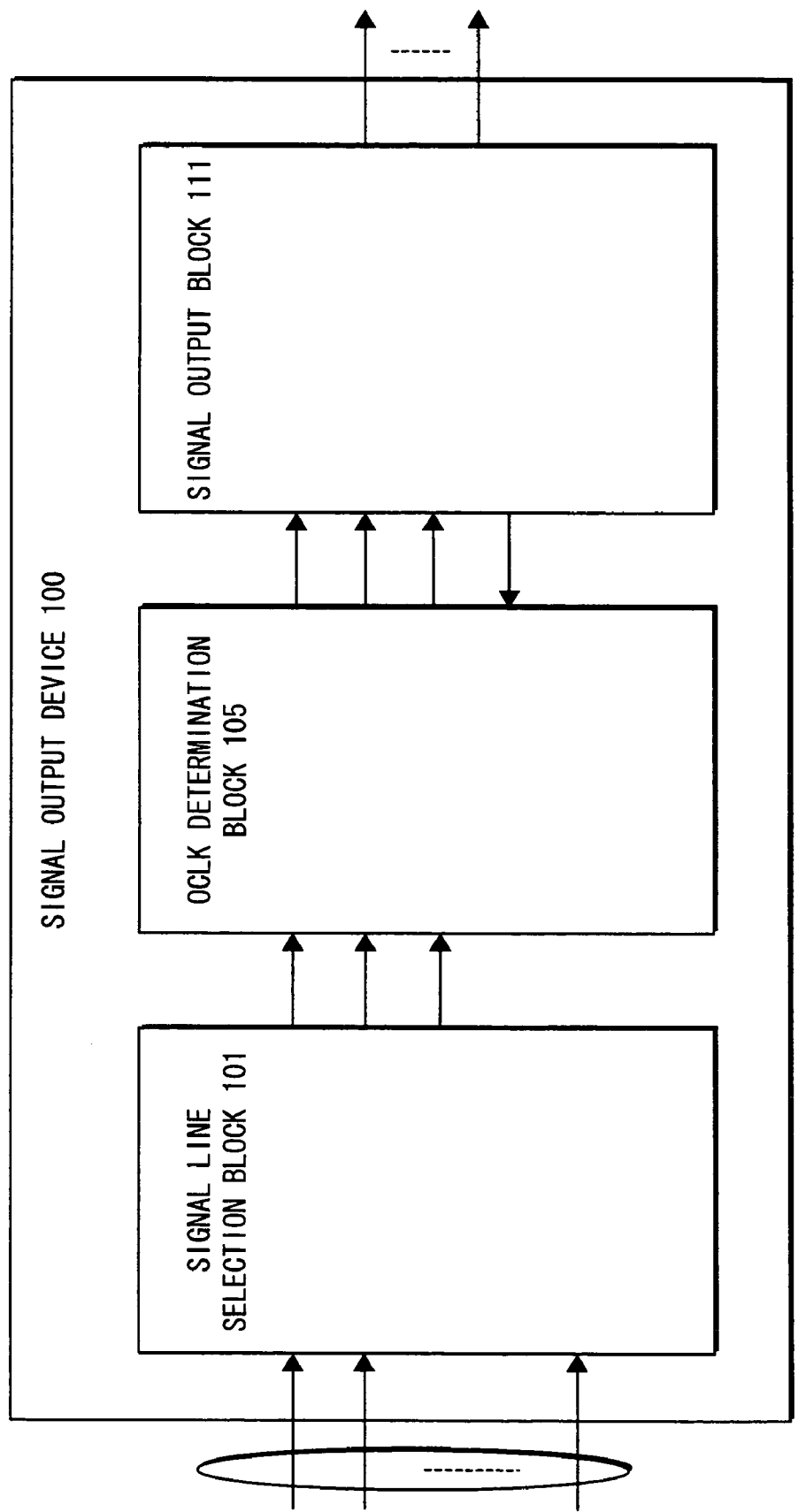
FIG. 1 is a block diagram showing a structure of a signal output device 100 pertaining to an embodiment 1.

FIG. 1 is a block diagram showing in brief the main part of signal output device 100.

As shown in FIG. 1, signal output device 100 has three main functional blocks, namely, a signal selection block 101, an output clock (OCLK) determination block 105, and a signal output block 111.

Signal Selection Block 101

Signal selection block 101 is connected to signal lines linking devices provided in a system LSI (SoC etc.), and selects the signal lines of signals that the user wants to observe (hereinafter "target signals") from these signal lines.

Figure 2:
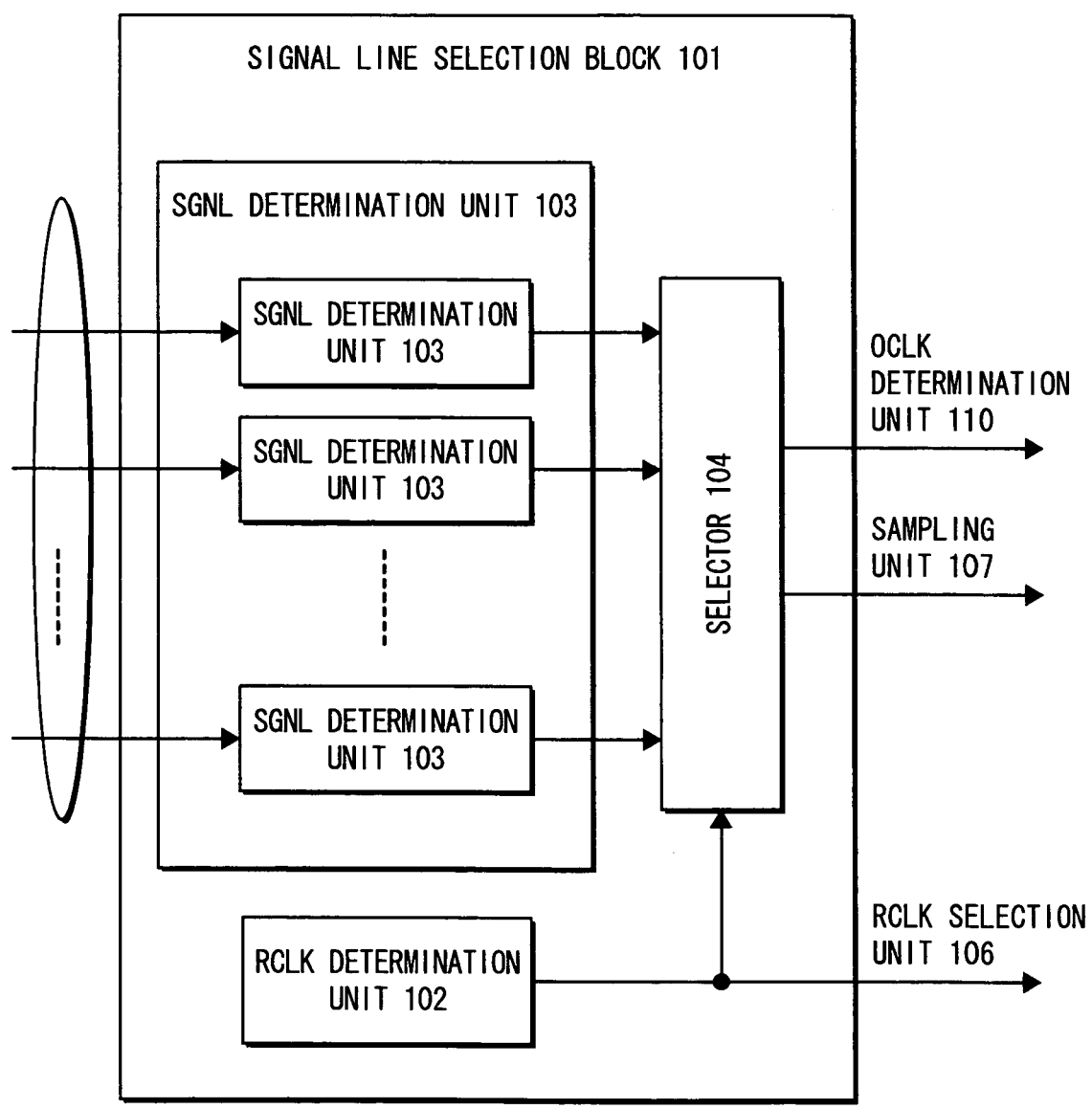
FIG. 2 is a block diagram showing a structure of a signal selection block 101 in signal output device 100.

FIG. 2 is a block diagram showing in detail the structure of signal selection block 101. As shown in FIG. 2, signal selection block 101 is provided with a reference clock (RCLK) determination unit 102, a signal determination unit 103, and a selector 104.

RCLK determination unit 102 determines a RCLK at which the user wants to perform outputting to an external device from a signal group operating at a plurality of RCLKs. This determination is performed through the user indicating a desired RCLK. Specifically, in the case of an input device being connected to a microprocessor provided in the IC package, the user is able to indicate a desired RCLK by inputting the clock ID of the RCLK via the input device.

Signal determination unit 103 selects and determines signal lines that the user wants to observe from signal lines operating at the determined RCLK. This determination is performed through the user indicating desired signal lines. Specifically, in the case of an input device being connected to a microprocessor provided in the IC package and numbers being allocated to individual signal lines, for example, the user is able to indicate desired signal lines by inputting the numbers of the signal lines via the input device.

Selector 104 selects the signal lines determined by signal determination unit 103 from signal lines operating at the determined RCLK.

OCLK Determination Block 105

OCLK determination block 105 imports signals selected by signal selection block 101 and determines an OCLK for when these signals are output.

Figure 3:
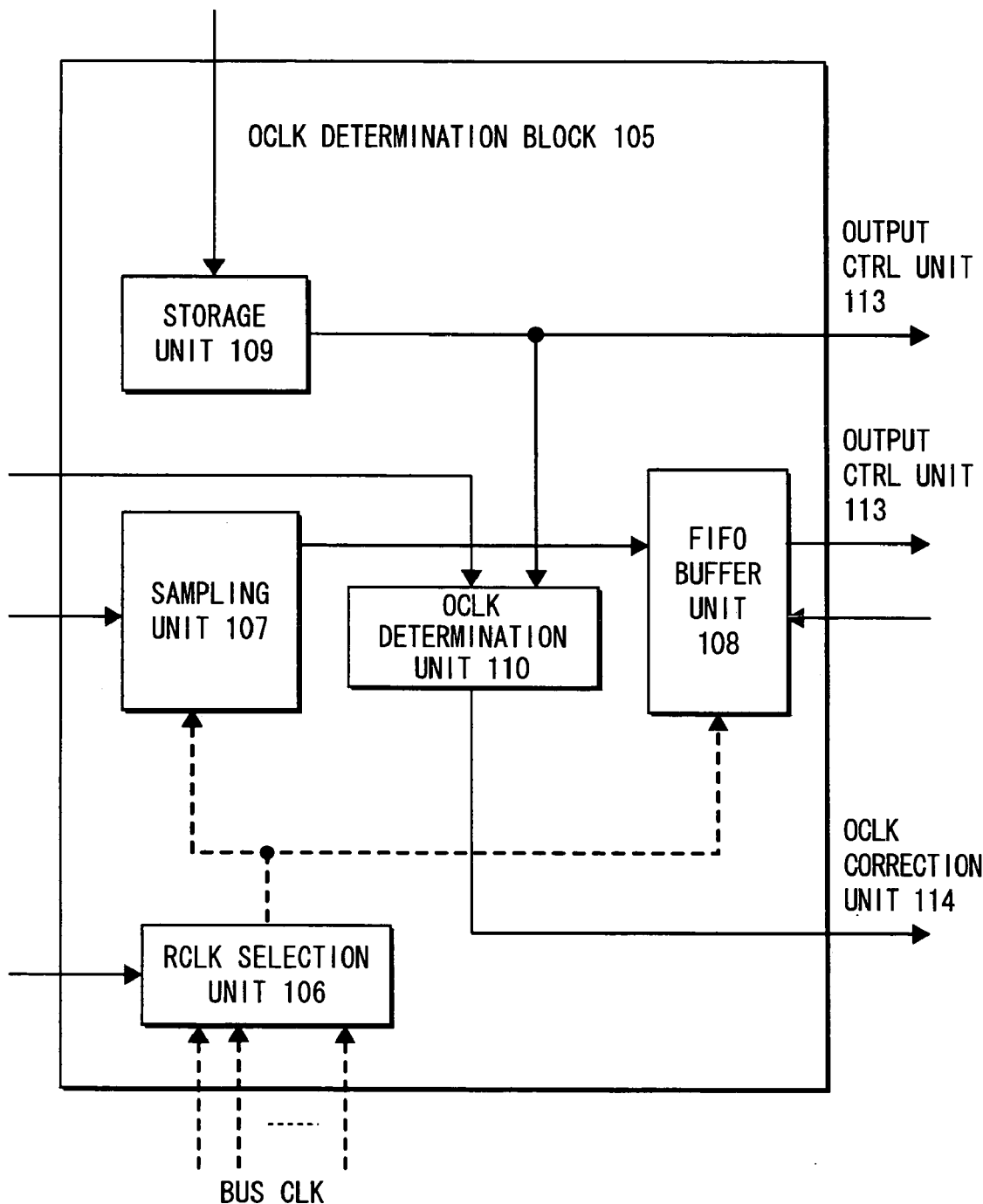
FIG. 3 is a block diagram showing a structure of an OCLK determination block 105 in signal output device 100.

FIG. 3 is a block diagram showing in detail the structure of OCLK determination block 105. As shown in FIG. 3, OCLK determination block 105 is provided with a reference clock (RCLK) selection unit 106, a sampling unit 107, a first-in first-out (FIFO) buffer 108, a storage unit 109, and an output clock (OCLK) determination unit 110.

Here, RCLK selection unit 106 selects the RCLK determined by RCLK determination unit 102 from a plurality of RCLKs input from an external source.

Sampling unit 107 imports signals carried by signal lines selected by selector 104 and sends the signals to FIFO buffer 108 (described below) at the RCLK selected by RCLK selection unit 106.

FIFO buffer 108 is an n-line buffer to match the n number of signal lines in signal output device 100, and accumulates signals sent from sampling unit 107 on a first-in first-out basis.

Storage unit 109 stores the number of observatory output terminals of the IC package in which signal output device 100 is implemented. In the case an input device being connected to a microprocessor provided in the IC package, data input by the user via the input device are stored.

OCLK determination unit 110 detects the number of signal lines selected by selector 104, and determines the optimum OCLK for outputting signals to the observatory output terminals provided in the IC package based on the detected number of signal lines, the selected RCLK, and the stored number of output terminals. Specifically, a frequency f (MHz) satisfying an expression $N*F \leq M*f$ is determined as the OCLK, where N is the number of signal lines selected by selector 104, F is the RCLK selected by RCLK selection unit 106, and M is the number of observatory output terminals stored by storage unit 109 ("*" indicates a multiplication) In particular, it is desirable to determined the minimum value as frequency f satisfying $N*F \leq M*f$ in the interests of not overly increasing the OCLK.

Signal Output Block 111

Signal output block 111 corrects a monitor clock input from an external source based on the OCLK determined by OCLK determination block 105, and outputs signals imported in FIFO buffer 108 to an external device via the observatory output terminals provided in the IC package at the corrected frequency. Note that the monitor clock input from an external source is the fastest clock at which signal output device 100 is operable.

Figure 4:
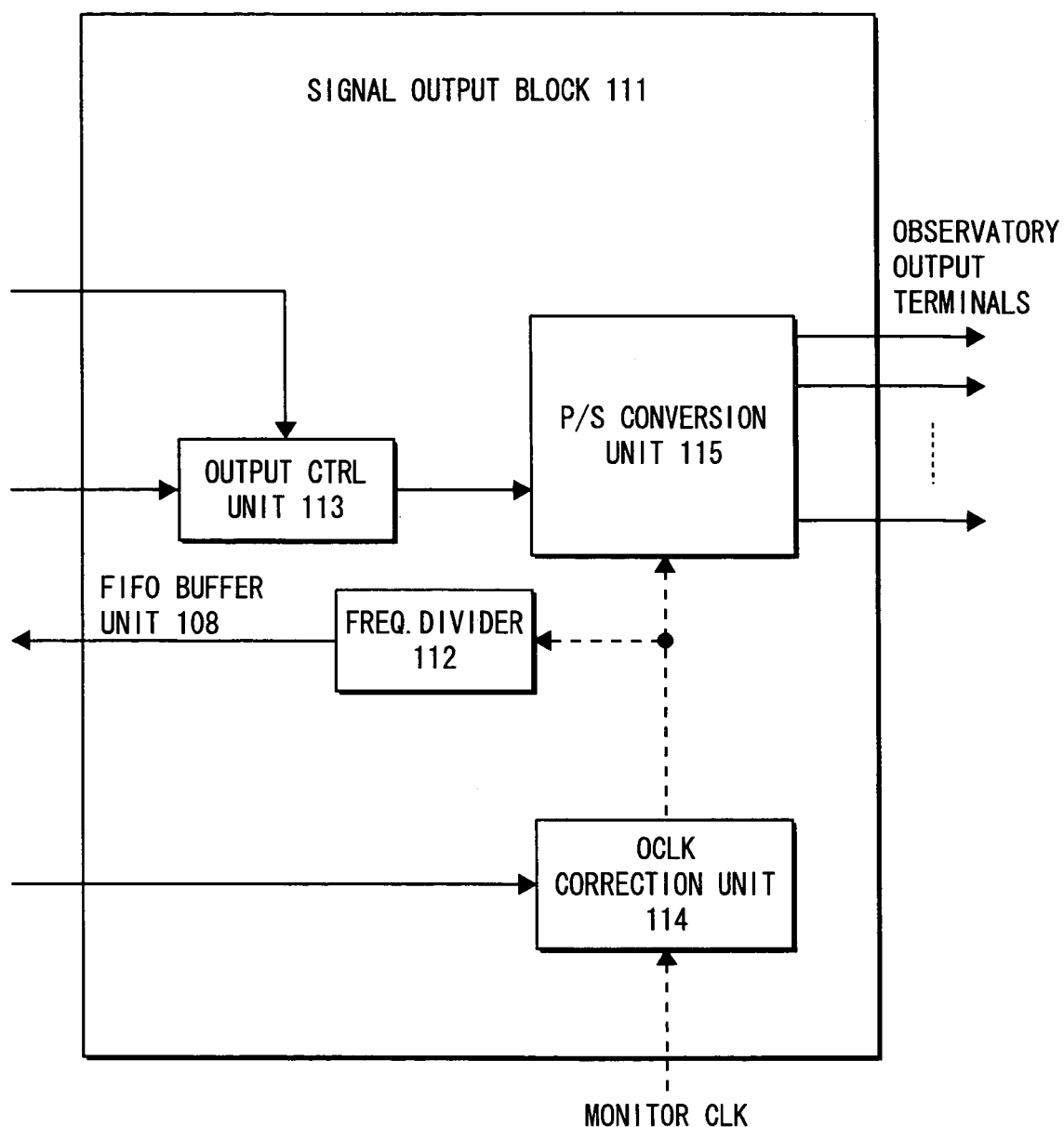
FIG. 4 is a block diagram showing a structure of a signal output block 111 in signal output device 100.

FIG. 4 is a block diagram showing in detail the structure of signal output block 111. As shown in FIG. 3, signal output block 111 is provided with a frequency divider 112, an output control unit 113, an output clock (OCLK) correction unit 114, and a parallel-to-serial (P/S) conversion unit 115.

Frequency divider 112 divides the monitor clock according to the signal line width of FIFO buffer 108, and determines the frequency for reading signals from FIFO buffer 108 using the divided frequency.

Output control unit 113 reads the signals from FIFO buffer 108 at the frequency determined by frequency divider 112, and sends the read signals to P/S conversion unit 115 (described below). At this time, the number of selected signal lines (N) is divided by the number of observatory output terminals (M), and the signals are sent to P/S conversion unit 115 after being dispersed equally over N/M number of signal line groups.

OCLK correction unit 114 divides the monitor clock based on the OCLK determined by OCLK determination unit 110 and corrects the OCLK. OCLK correction unit 114 should at least be a circuit capable of controlling the clock oscillation frequency such as a frequency divider or a phase-locked loop (PLL), for example.

Finally, P/S conversion unit 115 converts the signals to serial form. Specifically, the signals carried by the N/M signal line groups are output sequentially to the M number of observatory output terminals at the corrected OCLK.

2. Operations

According to the above structure, signal output device 100 performs signal output processing as follows.

A signal output operation performed by signal output device 100 is described here.

Figure 5:
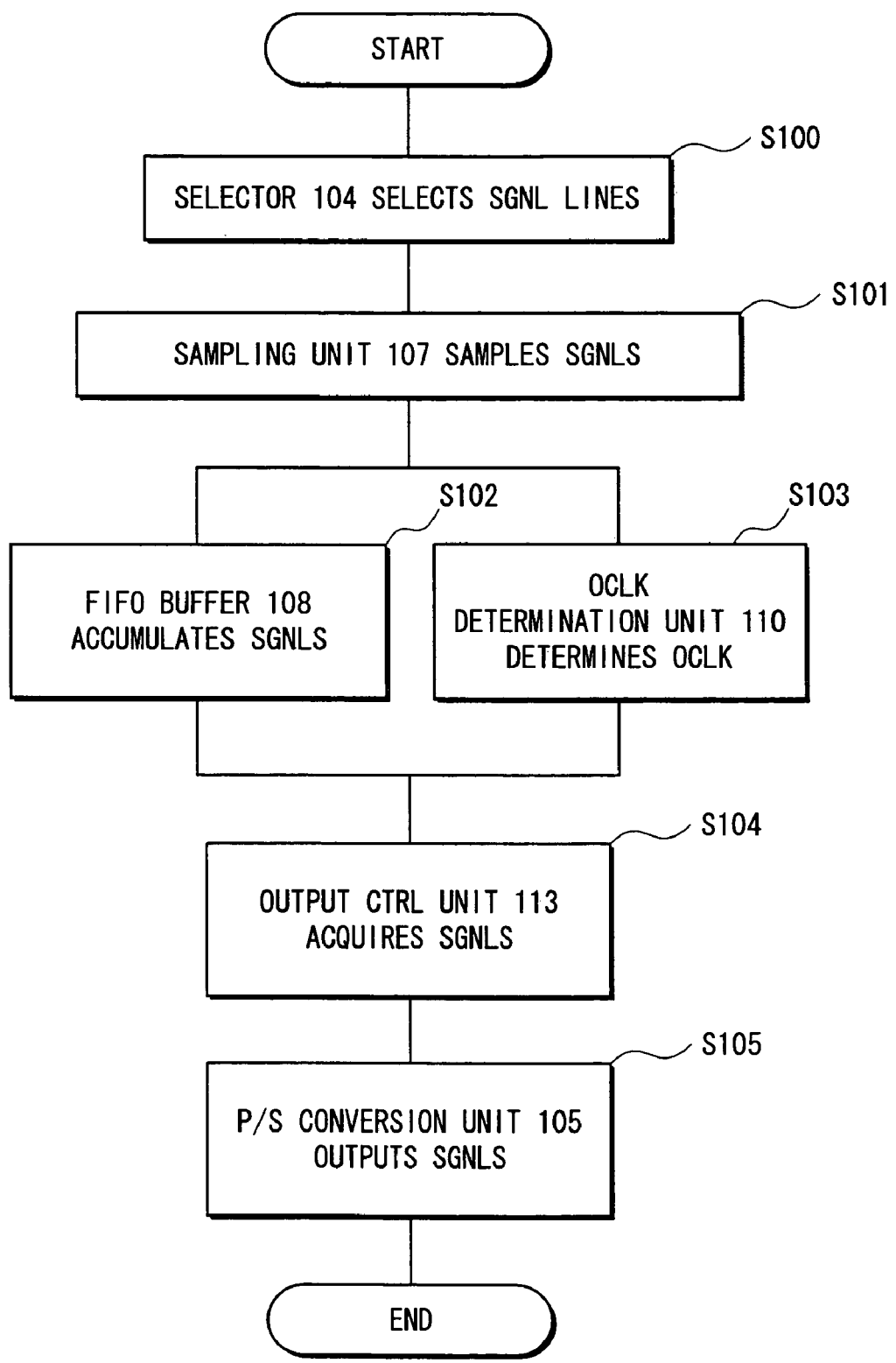
FIG. 5 is flowchart of a signal output operation performed by signal output device 100.

FIG. 5 is flowchart of the signal output operation performed by signal output device 100.

Referring to FIG. 5, firstly the signal lines of signals that the user want to output for observation are selected by signal selection block 101. Specifically, selector 104 selects signal lines determined by signal determination unit 103 from signal lines carrying signals operating at a RCLK determined by RCLK determination unit 102 (S100). Signals carried by the selected signal lines are sent in parallel to OCLK determination block 105.

Next, in OCLK determination block 105, sampling unit 107 samples the signals sent in parallel via signal selection block 101 (S101), and accumulates the sampled signals in FIFO buffer 108 (S102).

At the same time, OCLK determination unit 110 determines an optimum OCLK based on the number of signal lines selected by selector 104, the reference clock selected by RCLK selection unit 106, and the number of observatory output terminals stored by storage unit 109 (S103), and sends the determined OCLK to OCLK correction unit 114 in signal output block 111.

In signal output block 111, output control unit 113 then acquires the signals accumulated in FIFO buffer 108 (S104), and sends the acquired signals to P/S conversion unit 115 so that the signals will be dispersed equally from the observatory output terminals.

P/S conversion unit 115 converts the signals sent in parallel to serial form, and outputs the signals to the observatory output terminals at the OCLK obtained by correcting the monitor clock (S105).

2-1. SPECIFIC EXAMPLE

Signal output in the case of there being three observatory output terminals and nine selected signal lines operating at a 200 MHz RCLK is described here as a specific example.

Figure 6:
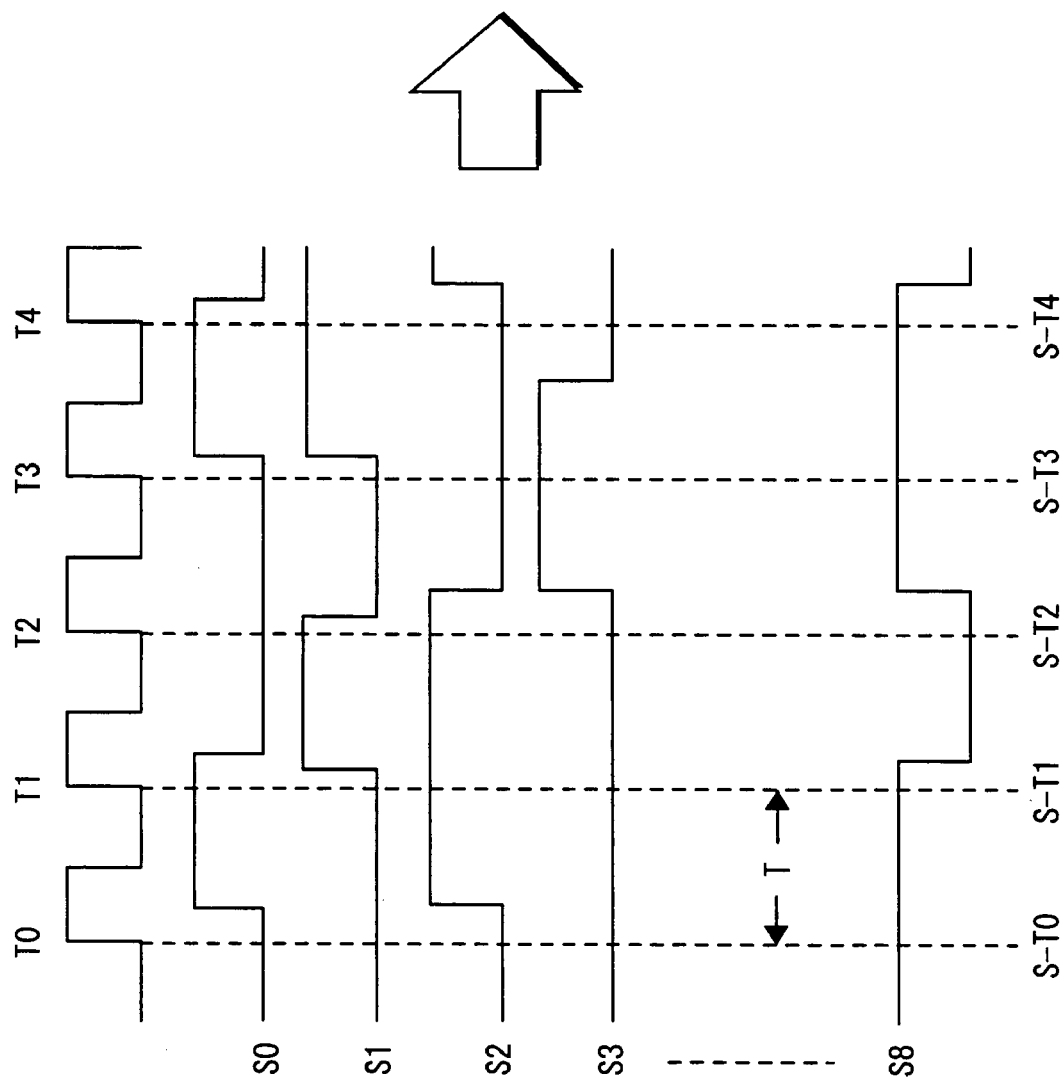
FIG. 6 is a schematic diagram of the signal output operation performed by signal output device 100.
Figure 7:
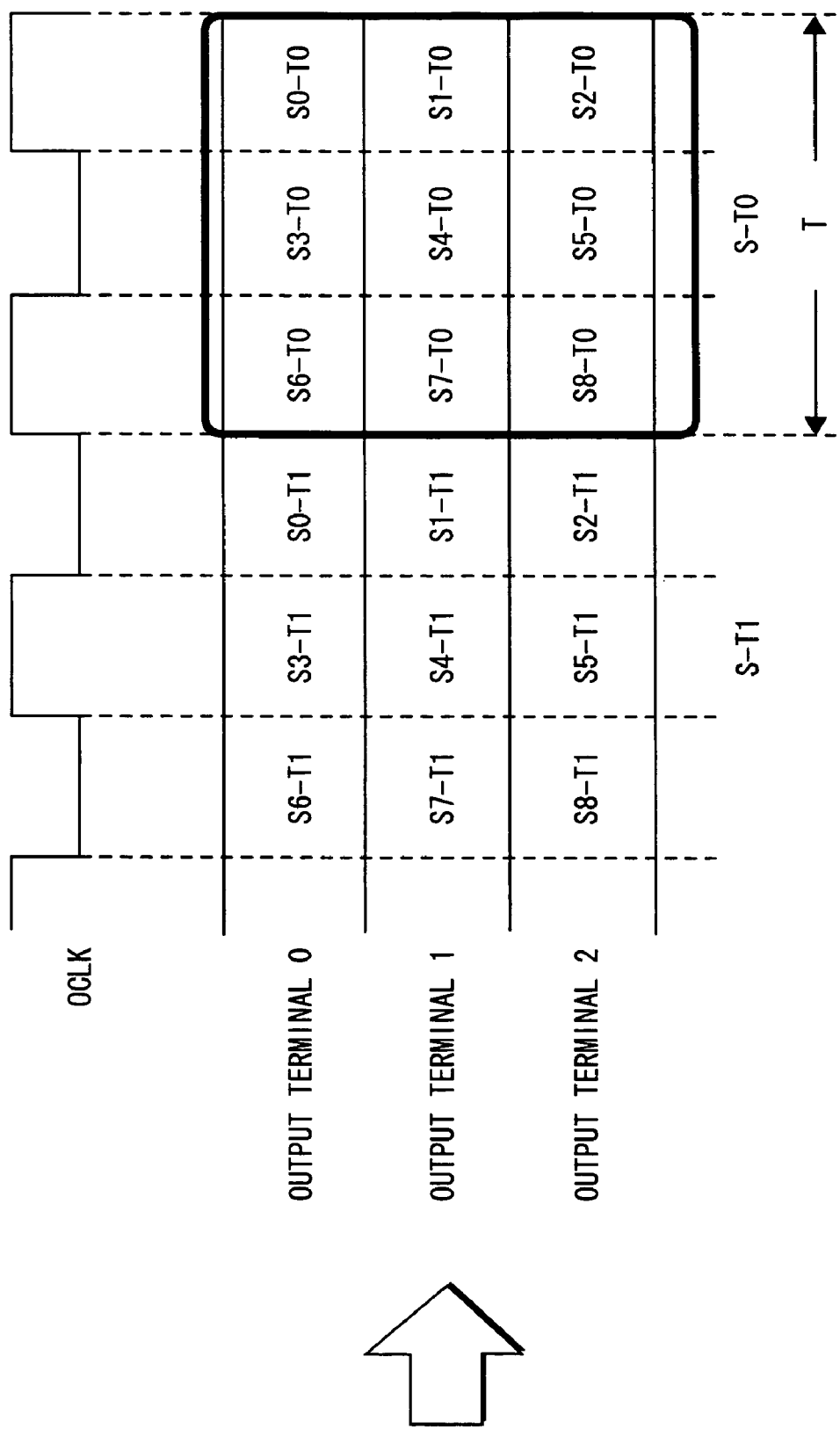
FIG. 7 is a schematic diagram of the signal output operation performed by signal output device 100.

FIGS. 6 and 7 are schematic diagrams showing the signal flow when signal output device 100 performs the signal output operation.

Firstly, referring to the left side of FIG. 6, nine signal lines S0–S8 are selected in the given example as signals for observation from the signal line group. Signal lines S0–S8 are each driven at RCLK cycles T, with signal waveforms from T0–T4 being shown in FIG. 6.

Focusing on signal S0, the signal values in cycles T0–T4 are respectively 0 1 0 0 1, while the same values for signal S1 are respectively 0 0 1 0 1.

One cycle (T in FIG. 6) is $\frac{1}{200}$ sec given the 200 MHz RCLK.

Once selector 104 has selected the nine signal lines S0–S8, sampling unit 107 samples the signals of signal lines S0–S8 at 200 MHz.

Sampled signals are sent to FIFO buffer 108, where they are accumulated in parallel on every cycle, as shown on the right side of FIG. 6.

At the same time, OCLK determination unit 110 calculates the smallest frequency f satisfying 9 (no. of signal lines) *200 (RCLK in MHz)$\leq$3 (no. of observatory output terminals) *f based on the above expression to determine 600 MHz as the OCLK.

Once the OCLK has been determined, OCLK correction unit 114 corrects the monitor clock (e.g. 1.8 GHz), which is the fastest clock at which signal output device 100 can operate, to 600 MHz.

Output control unit 113 then reads the signals from FIFO buffer 108, and sends the read signals to P/S conversion unit 115. At this time, output control unit 113 sends the read signals to P/S conversion unit 115 in units of 3 (=no. of observatory output terminals) so that the signals will be dispersed from the observatory output terminals. Specifically, the signals are sent three at a time to P/S conversion unit 115 in the order S0–S2, S3–S5, and S6–S8.

Finally, P/S conversion unit 115 outputs the signals input three at a time sequentially at 600 MHz (i.e. at $\frac{1}{600}$ sec cycles) so as to be dispersed in order over observatory output terminals 0 to 2.

Referring to FIG. 7, signals S0, S1 and S2 are sequentially output from observatory output terminals 0, 1 and 2 on the first 600 MHz cycle. Signals S3–S5 are then output respectively from observatory output terminals 0 to 2 on the second OCLK cycle, and signals S6–S8 are output respectively from observatory output terminals 0 to 2 on the third OCLK cycle.

Likewise, from the forth OCLK cycle onward, signals S0, S3 and S6 are output from observatory output terminal 0, signals S1, S4 and S7 are output from observatory output terminal 1, and signals S2, S5 and S8 are output from observatory output terminal 2.

Thus, in the present embodiment, the nine signals S0–S8 input in parallel as shown in FIG. 6 are output in serial form as shown in FIG. 7 at an OCLK that reflects the number of observatory output terminals.

By performing signal output in this manner, signal lines that the user wants to observe can be freely selected, and the OCLK for outputting signals to an external device via output terminals can be dynamically changed depending on the selected number of signal lines. A plurality of signals operating at a prescribed reference clock can thus be observed in real time by an external device even if there are only a limited number of output terminals.

Embodiment 2

1. Differences with Embodiment 1

Embodiment 2 of the present invention is described below based on FIGS. 8–10.

Embodiment 2 is a variation of embodiment 1 in which cycle boundary (CYCB) signals are output showing the boundary between periods in which signals sampled on every cycle of the RCLK are output, when P/S conversion unit 115 outputs signals via observatory output terminals at the OCLK.

In embodiment 2, the IC package includes an output terminal for use in outputting CYCB signals (hereinafter "cycle boundary signal (CYCB-SGNL) output terminal").

Figure 8:
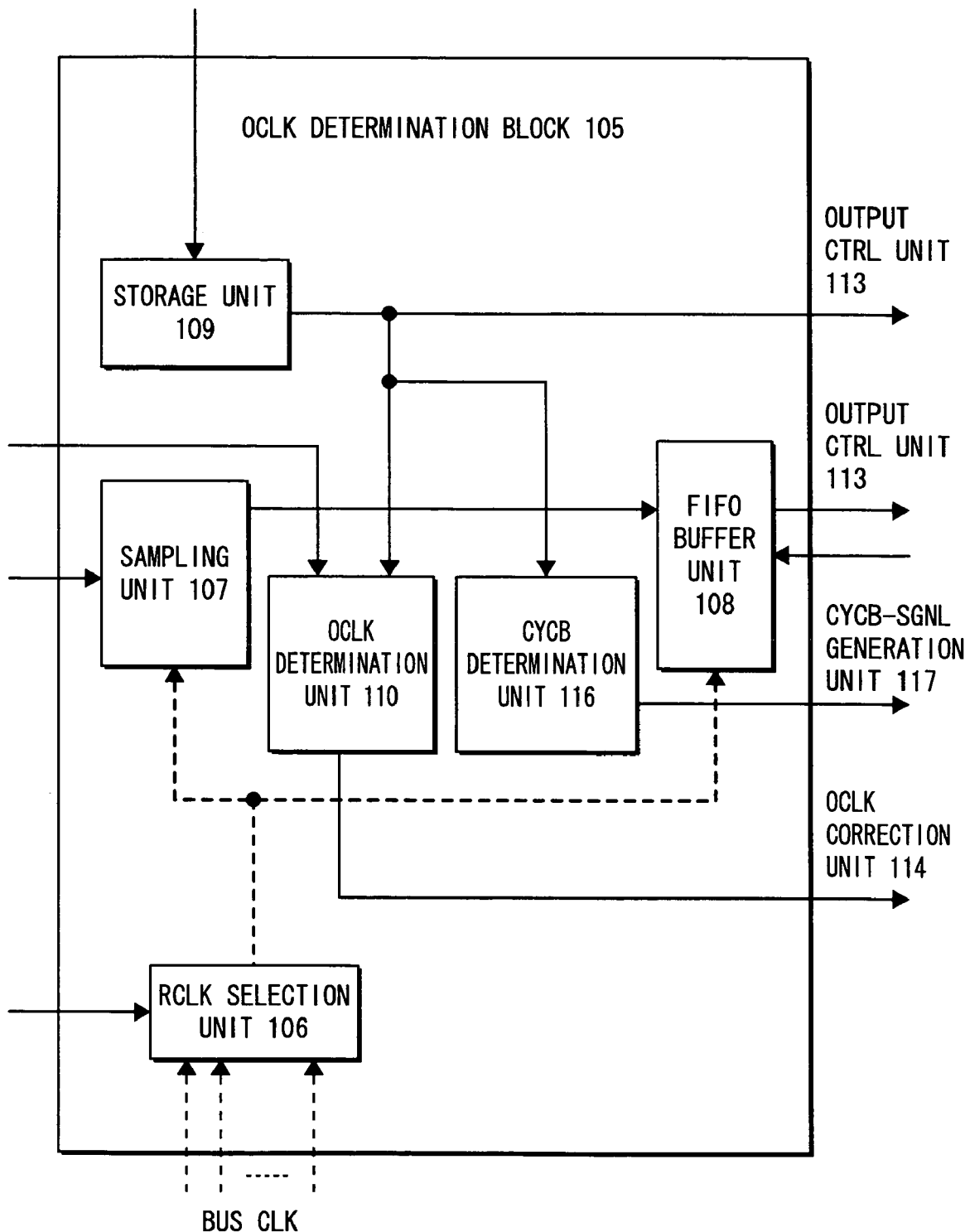
FIG. 8 is a block diagram showing a structure of OCLK determination block 105 in an embodiment 2.

FIG. 8 is a block diagram showing a structure of OCLK determination block 105 pertaining to embodiment 2.

Figure 9:
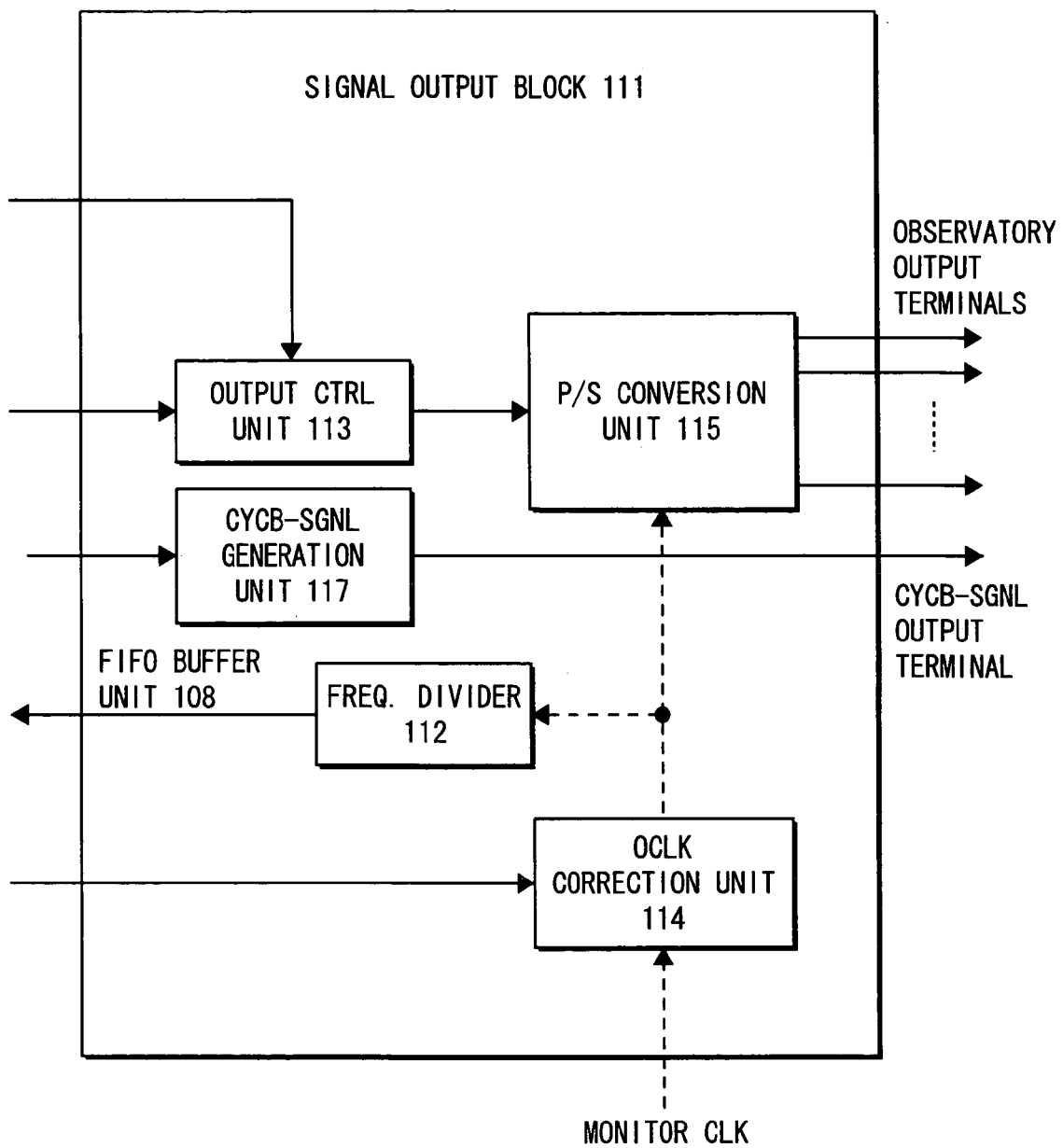
FIG. 9 is a block diagram showing a structure of signal output block 111 in embodiment 2.

FIG. 9 is a block diagram showing a structure of signal output block 111 pertaining to embodiment 2.

Note that the same reference signs are appended to elements that are the same as embodiment 1, with description of these elements being omitted here.

As shown in FIG. 8, a cycle boundary (CYCB) determination unit 116 has been added to OCLK determination block 105.

As shown in FIG. 9, a cycle boundary signal (CYCB-SGNL) generation unit 117 has been added to signal output block 111.

CYCB determination unit 116 determines when the boundary between periods in which signals sampled on every RCLK cycle are output will appear per number of OCLK cycles when outputting signals at the OCLK via the observatory output terminals, based on the number of signal lines selected by selector 104 and the number of observatory output terminals stored by storage unit 109. Specifically, if N (no. of signal lines)/M(no. of observatory output terminals)=p, we know that the end position of periods in which the signals sampled on every RCLK cycle are output will appear every p OCLK cycles.

Note that in the case of the N number of signal lines not being divisible by the M number of observatory output terminals (i.e. N/M=p remainder q; q<M), the end position is determined to be every p+1 OCLK cycles.

CYCB-SGNL generation unit 117 generates a CYCB signal every p OCLK cycles based on the p value determined by CYCB determination unit 116, and outputs the generated CYCB signals via the CYCB-SGNL output terminal at the OCLK corrected by OCLK correction unit 114.

2. SPECIFIC EXAMPLE

CYCB signal output in the case of there being four output terminals in total (3 observatory+1 for outputting CYCB signals) and nine selected signal lines operating at a 200 MHz RCLK is described here as a specific example.

Figure 10:
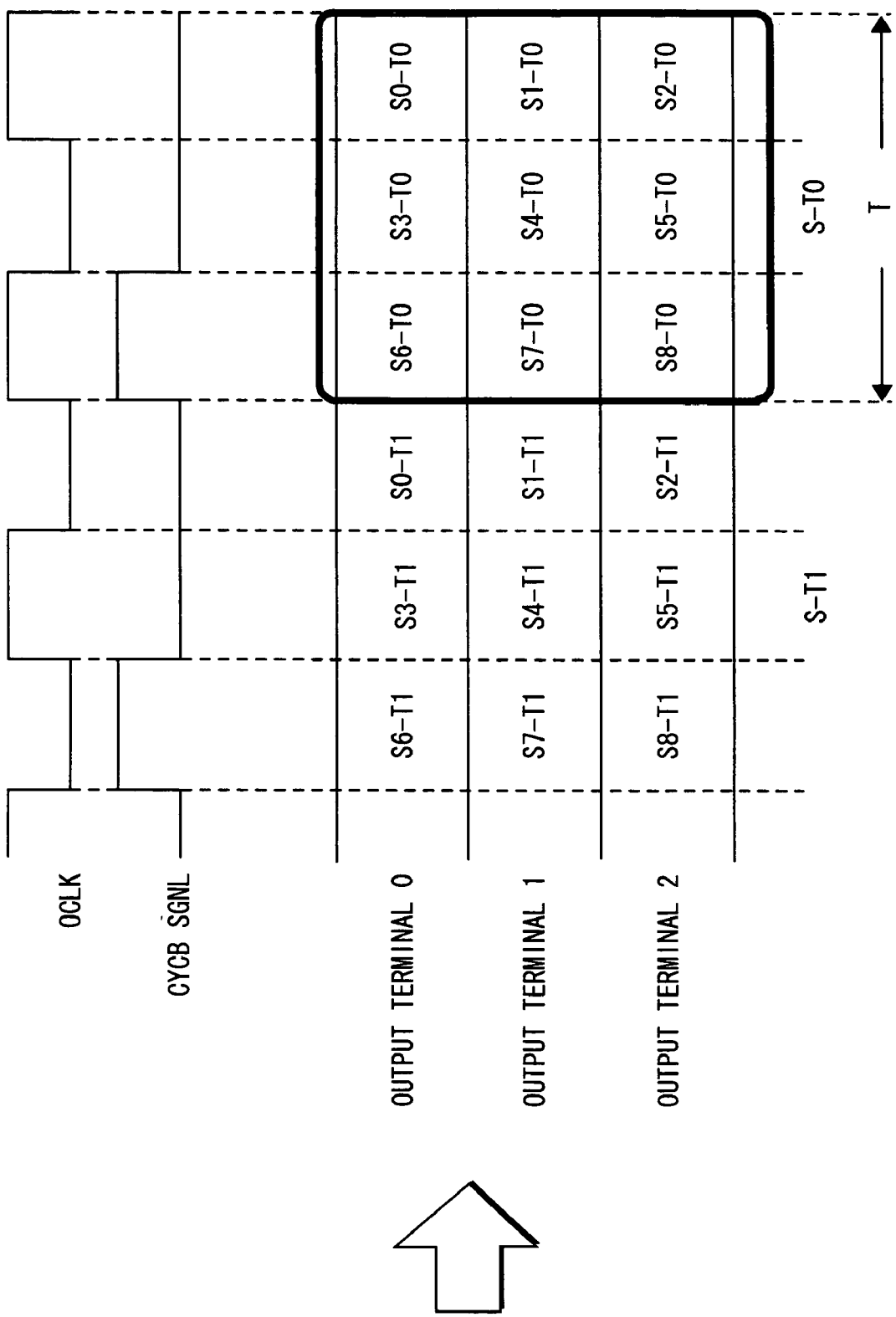
FIG. 10 is a schematic diagram of a signal output operation performed by signal output device 100 in embodiment 2.

FIG. 10 is a schematic diagram showing the signal flow when signal output device 100 performs a signal output operation according to the present embodiment.

Since the selected number of signal lines is again nine in the given example, the signal flow from signal line selection to signal accumulation in FIFO buffer 108 is the same as embodiment 1.

CYCB determination unit 116 calculates 9 (selected no. of signal lines)/3(no. of observatory output terminals)=3, and thereby determines that the boundary between periods in which signals sampled in individual RCLK cycles are output occurs every three OCLK cycles.

Once the cycle boundary frequency has been determined, CYCB-SGNL generation unit 117 outputs the CYCB signal via the CYCB-SGNL output terminal every three OCLK (600 MHz) cycles as shown in FIG. 10.

Thus, in the present embodiment, as shown in FIG. 10, a signal is output indicating the boundary between periods in which signals sampled on every RCLK cycle are output, via an output terminal that is not one of the observatory output terminals.

The user can thus be aware of the start position of RCLK cycles when observing signals output via observatory output terminals at the OCLK. In other words, the user is able to grasp which RCLK cycle the signals being observed belong to.

Embodiment 3

1. Differences with Embodiment 1

Embodiment 3 of the present invention is described below based on FIGS. 11–14.

Embodiment 3 is a variation of embodiment 1. In the case of the number of selected signal lines and the number of observatory output terminals not being integer multiples of one another, the signals initially read on every RCLK cycle will not be the signals initially output from the observatory output terminals on every OCLK cycle. In view of this, padding is performed in embodiment 3 by outputting dummy signals (i.e. fixed value signals) together with the target signals, so that the signals sampled on one RCLK cycle are shaped to enable them to be output within a period equivalent to the one cycle even if the number of selected signal lines and the number of observatory output terminals are not integer multiples of one another.

Furthermore, when P/S conversion unit 115 outputs signals via the observatory output terminals, padding identification (PID) signals are output that show the number of dummy signals output on every OCLK cycle and identify the observatory output terminals via which dummy signals are output.

In embodiment 3, the IC circuit is provided with an output terminal for use in outputting PID signals (hereinafter "PID-SGNL output terminal").

Figure 11:
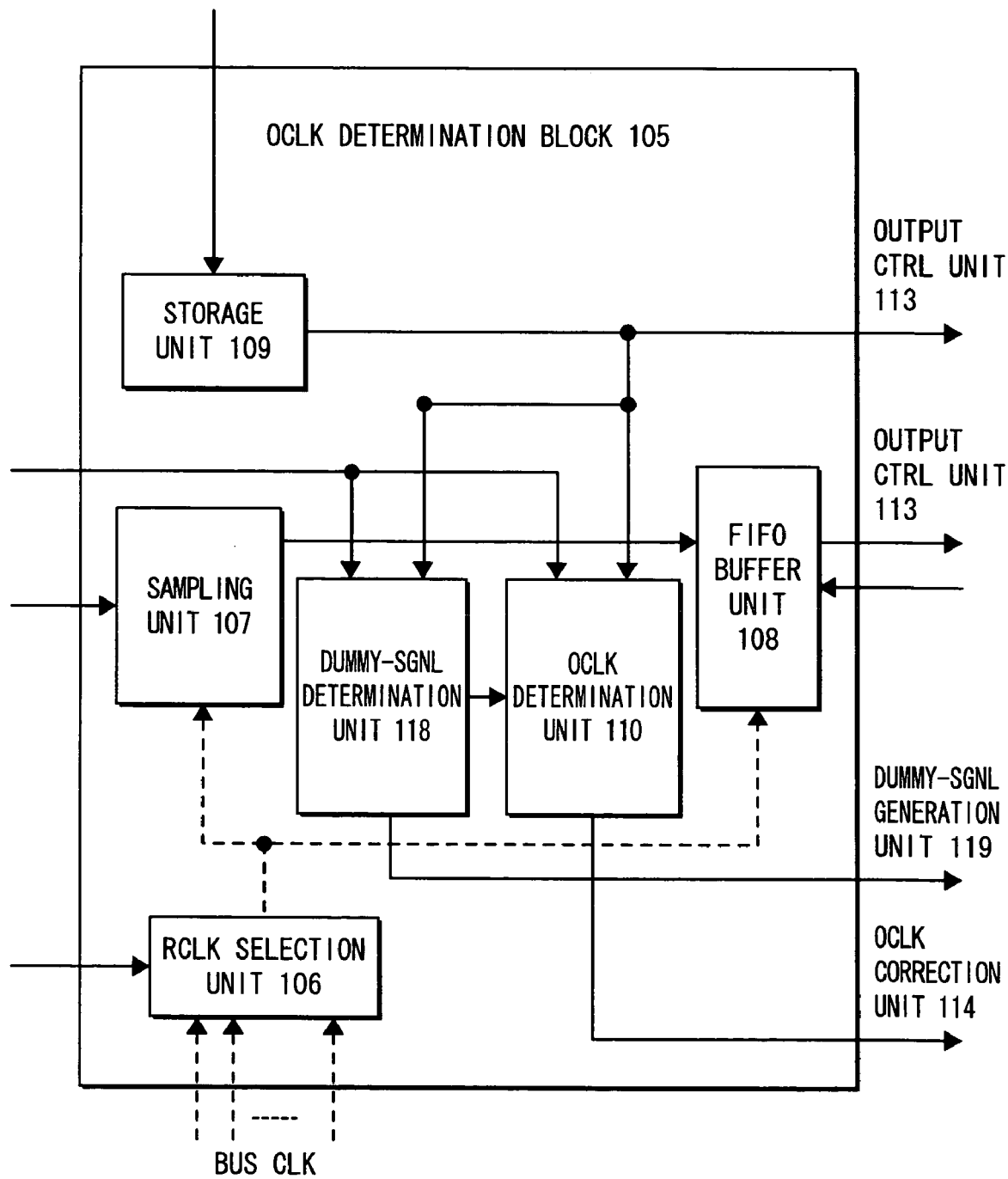
FIG. 11 is a block diagram showing a structure of OCLK determination block 105 in an embodiment 3.

FIG. 11 is a block diagram showing a structure of OCLK determination block 105 pertaining to embodiment 3.

Figure 12:
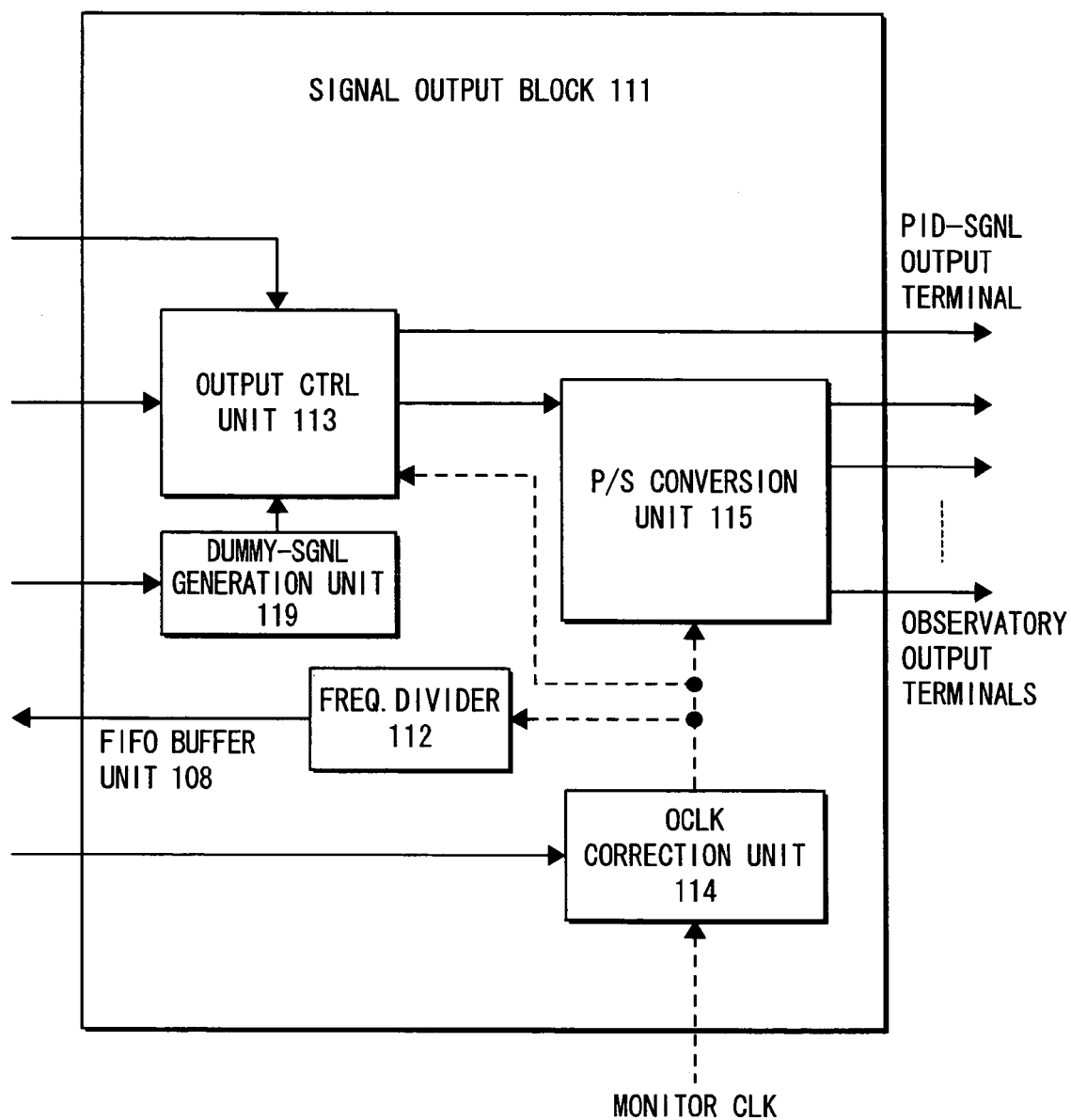
FIG. 12 is a block diagram showing a structure of signal output block 111 in embodiment 3.

FIG. 12 is a block diagram showing a structure of signal output block 111 pertaining to embodiment 3.

Note that the same reference signs are appended to elements that are the same as embodiment 1, with description of these elements being omitted here.

As shown in FIG. 11, a dummy signal (DUM-SGNL) determination unit 118 has been added to OCLK determination block 105.

As shown in FIG. 12, a dummy signal (DUM-SGNL) generation unit 119 has been added to signal output block 111.

DUM-SGNL determination unit 118 firstly investigates whether the selected number of signal lines and the number of observatory output terminals are integer multiples of one another, based on the N number of signal lines selected by selector 104 and the M number of observatory output terminals stored in storage unit 109. If one number is not fully divisible by the other number, DUM-SGNL determination unit 118 calculates the number of dummy signals that should be added to the target signals. Specifically, if N/M=p remainder q (q<M), DUM-SGNL determination unit 118 determines that (M−q) number of dummy signals should to be added to the target signals.

DUM-SGNL generation unit 119 generates (M−q) number of dummy signals based on the (M−q) number determined by DUM-SGNL determination unit 118, and outputs the generated dummy signals to output control unit 113.

In addition to padding the target signals by adding the q number of dummy signals at the end of the signals on every cycle read from FIFO buffer 108 and outputting the padded signals to P/S conversion unit 115, output control unit 113 outputs PID signals via the PID output terminal that show the number of dummy signals on every OCLK cycle and identify the observatory output terminals via which dummy signals are output.

The PID signal in respective clocks is set to a "01" flag if one dummy signal is included and a "10" flag if two dummy signals are included, while being kept at "00" if no dummy signals are included.

Note that in this case, OCLK determination unit 110 determines frequency f (MHz) satisfying an expression $(N+q)*F \leq M*f$ as the OCLK, where N is the number of selected signal lines, q is the determined number of dummy signals, F is the selected RCLK, and M is the stored number of observatory output terminals.

2. SPECIFIC EXAMPLE

Dummy signal output in the case of there being four output terminals in total (3 observatory+1 for outputting PID signals) and seven selected signal lines S0–S6 operating at a 200 MHz RCLK is described here as a specific example.

Figure 13:
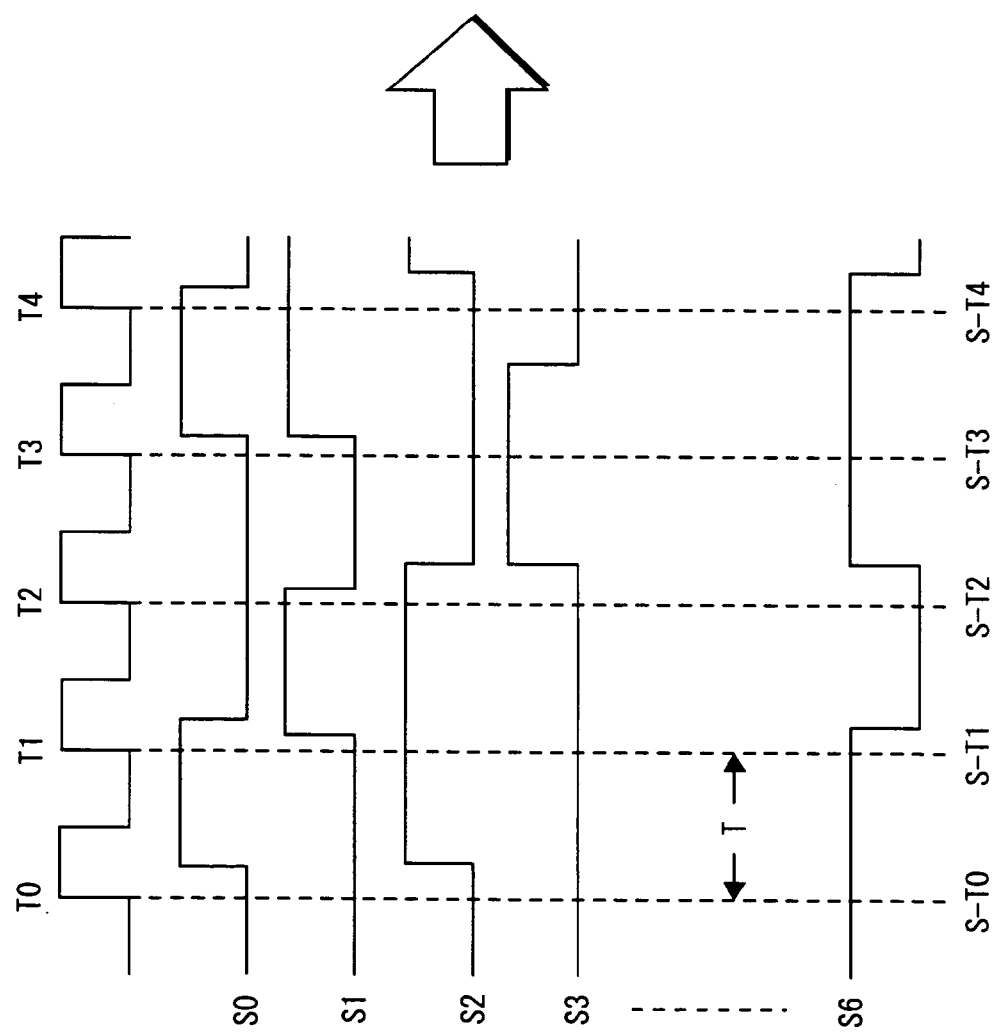
FIG. 13 is a schematic diagram of a signal output operation performed by signal output device 100 in embodiment 3.
Figure 14:
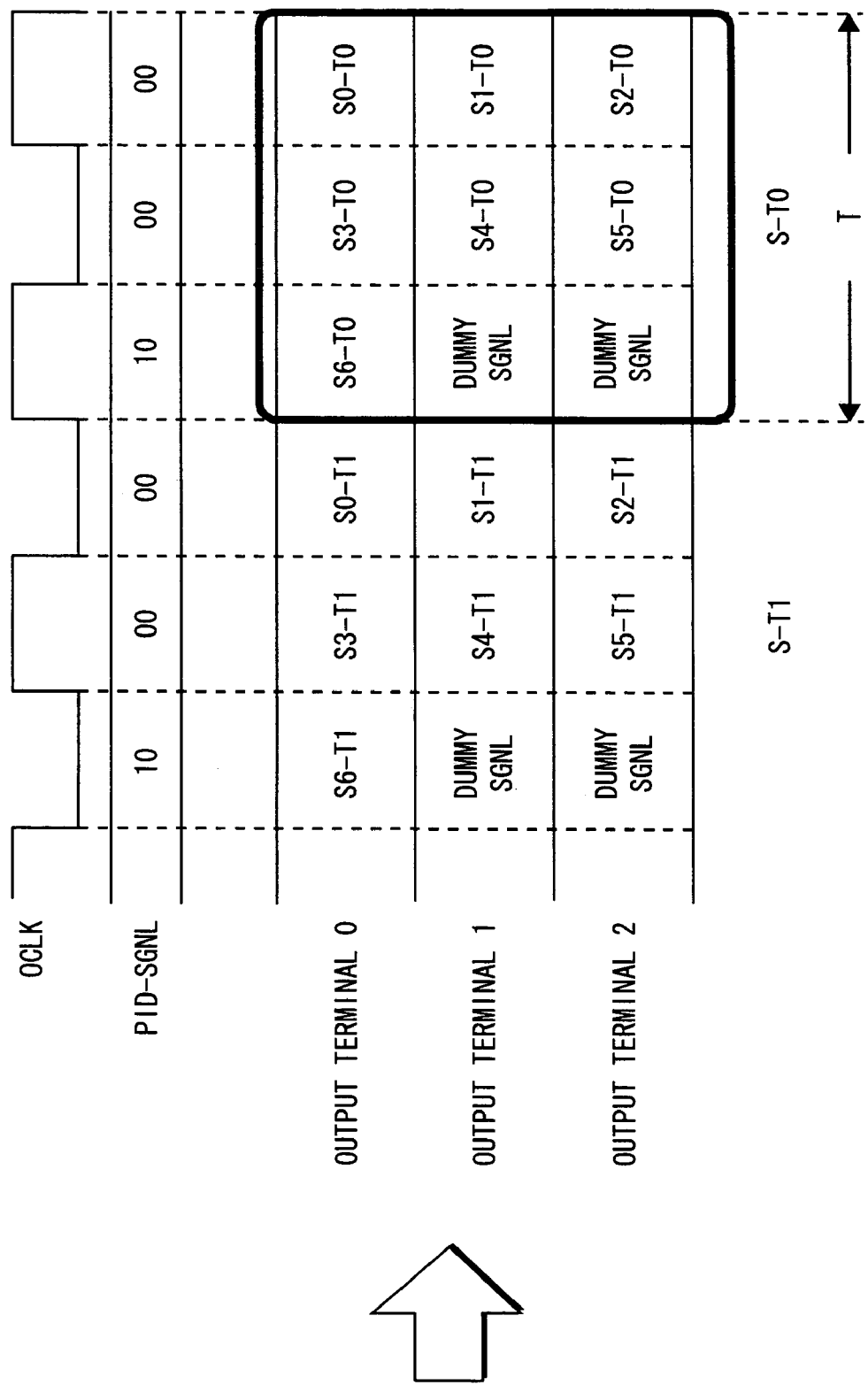
FIG. 14 is a schematic diagram of the signal output operation performed by signal output device 100 in embodiment 3.

FIGS. 13 and 14 are schematic diagrams showing the signal flow when signal output device 100 performs a signal output operation according to the present embodiment.

Selector 104 selects the seven signal lines S0–S6 as shown on the left side of FIG. 13, and FIFO buffer 108 accumulates the signals on every RCLK cycle in parallel as shown on the right side of FIG. 13.

Here, DUM-SGNL determination unit 118 calculates 7 (no. of selected signal lines)/3(no. of observatory output terminals)=2 remainder 1, and thereby determines that two dummy signal should be appended.

Once the number of dummy signals has been determined, DUM-SGNL generation unit 119 generates the determined number of dummy signals (=2) and outputs the generated dummy signals to output control unit 113.

On receiving the dummy signals, output control unit 113 controls the padded signals to be output via the observatory output terminals as shown in FIG. 14 by sending the signals to P/S conversion unit 115 with the two received dummy signals added at the end of the signals on every cycle read from FIFO buffer 108.

At this time, a "10" PID signal is output in cycles of the 600 MHz OCLK in which padding is performed using the two dummy signals.

Note that OCLK determination unit 110 determines 600 MHz (OCLK) as the smallest frequency f satisfying the expression $(7+2)*200 \leq 3*f$, where 7 is the number of selected signal lines, 2 is the determined number of dummy signals, 200 is the selected RCLK (MHz), and 3 is the stored number of observatory output terminals.

Thus, in the present embodiment, as shown in FIG. 14, dummy signals are added at the end of the signals sampled in one RCLK cycles to shape the signals so that they can be output within a period equivalent to the one cycle even if the number of selected signal lines and the number of observatory output terminals are not integer multiples of one another.

Furthermore, observation of output signals at the OCLK is facilitated given that the user can be aware of when dummy signals are output due to the outputting of PID signals showing whether dummy signals are included in respective cycles of the OCLK when the signals are output via the observatory output terminals.

Embodiment 4

1. Differences with Embodiment 1

A signal output device 200 pertaining to embodiment 4 of the present invention is described next.

Embodiment 4 is a variation of embodiment 1 configured to output target signals operating at a plurality of RCLKs to an external device.

Signal output device 200 is composed of three functional block groups, with a signal selection block 201, an output clock (OCLK) determination block 205 and a signal output block 211 as one functional block group, so as to deal with target signals operating at a maximum of three different RCLKs.

In embodiment 4, the IC package is provided both with the CYCB signal and PID-SGNL output terminals described in embodiments 2 and 3, and with a clock boundary signal (CLKB-SGNL) output terminal for outputting clock boundary (CLKB) signals showing the boundary where signal groups output per number of OCLK cycles change when outputting signals at the OCLK.

Note that the number of signal lines in signal output device 200 per functional block group is assumed to be n, and the number of observatory output terminals is assumed to be M.

Figure 15:
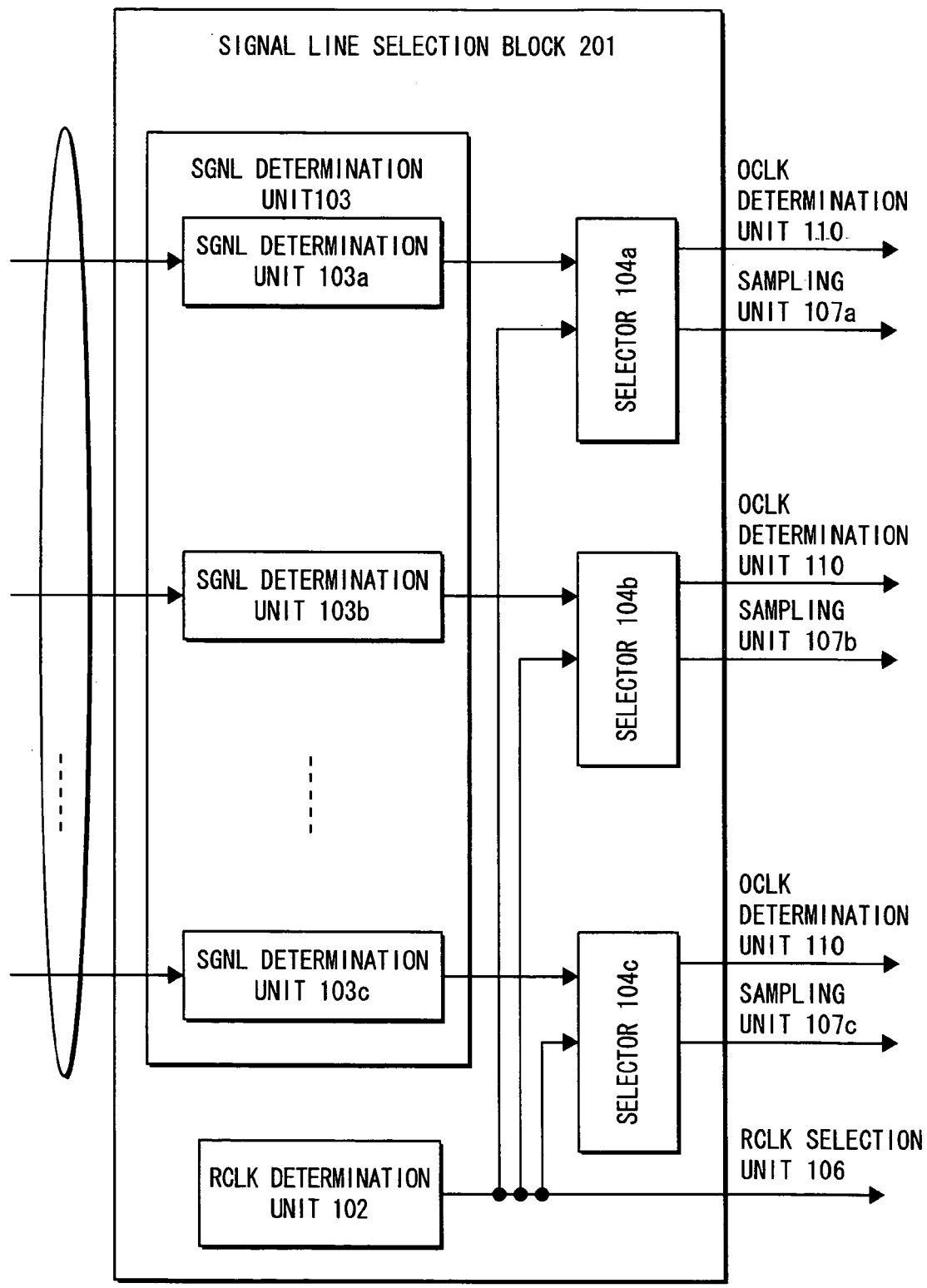
FIG. 15 is a block diagram showing a structure of a signal selection block 201 in a signal output device 200 pertaining to an embodiment 4.

FIG. 15 is a block diagram showing in detail the structure of signal selection block 201.

Figure 16:
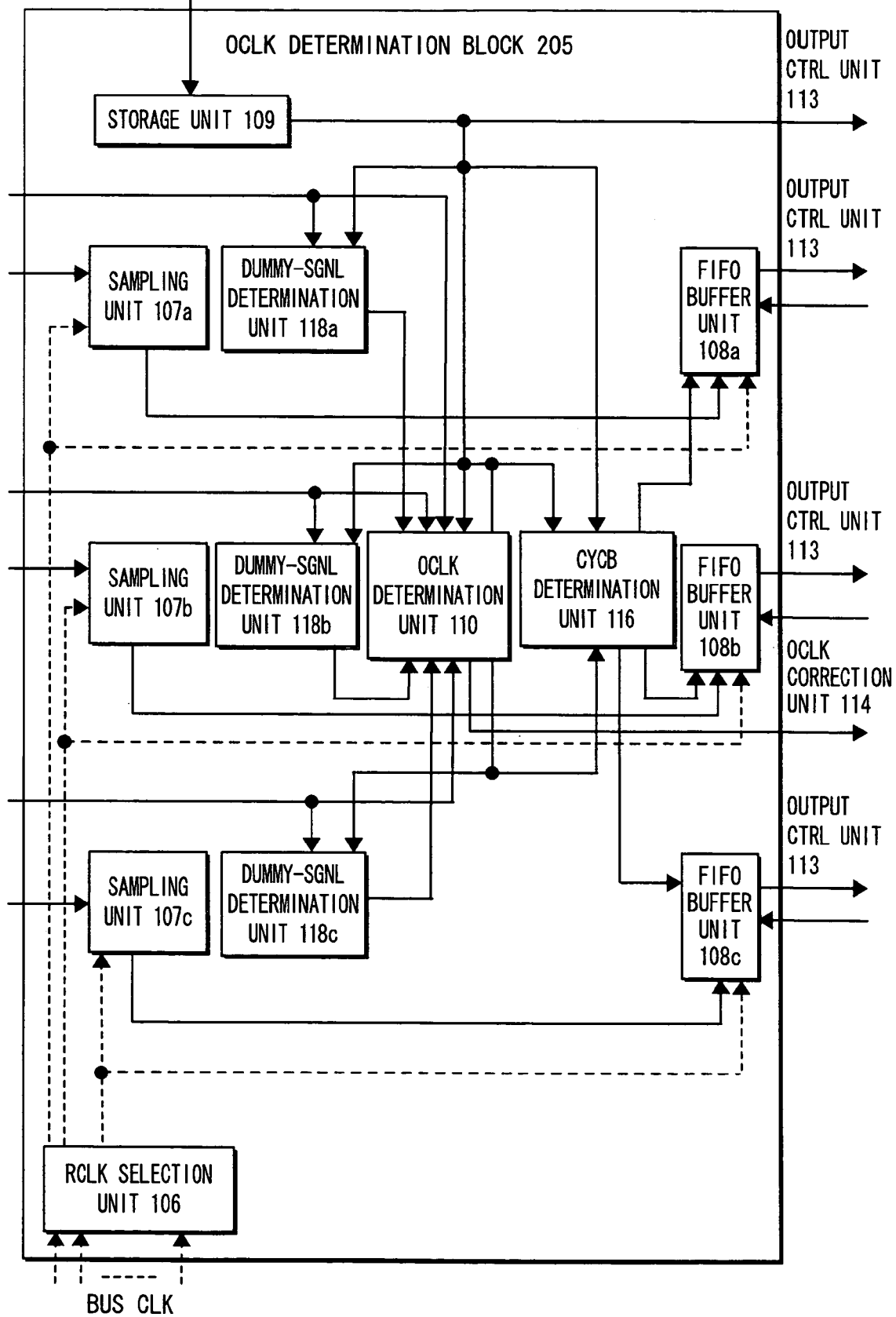
FIG. 16 is a block diagram showing a structure of an OCLK determination block 205 in signal output device 200.

FIG. 16 is a block diagram showing in detail the structure of OCLK determination block 205.

Figure 17:
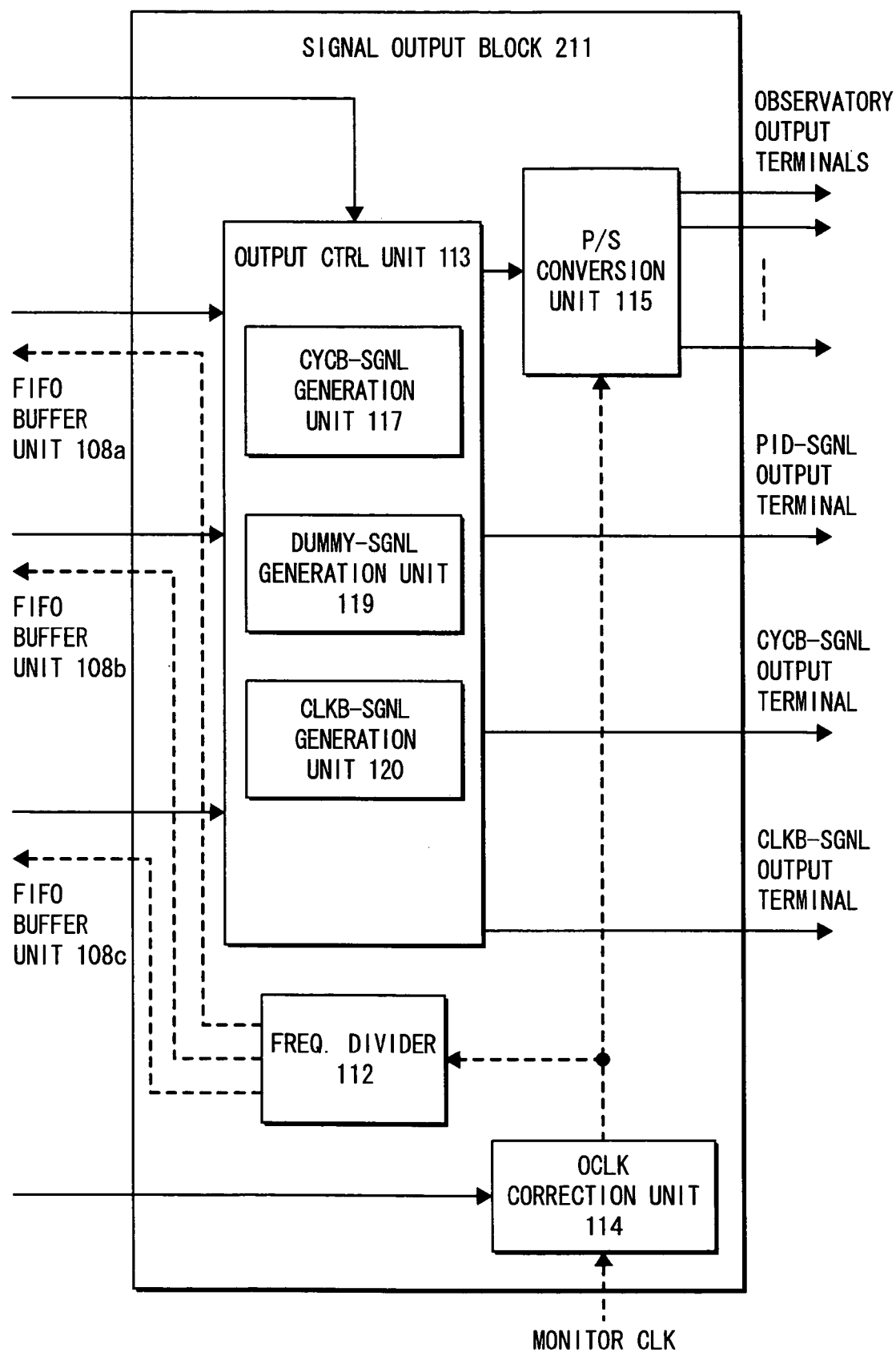
FIG. 17 is a block diagram showing a structure of a signal output block 211 in signal output device 200.

FIG. 17 is a block diagram showing in detail the structure of signal output block 211.

Note that the same reference signs are appended to elements that are the same as embodiments 1 to 4, with description of these elements being omitted here.

As shown in FIG. 15, signal selection block 201 is provided with signal determination unit 103 and three selectors 104a –104c. This is to allow signals operating at a maximum of three reference clocks to be selected at the same time.

Signal determination unit 103 selects and determines signal lines that the user wants to observe from signal lines for each of the RCLKs.

Selectors 104a–104c respectively select the signal lines determined by signal determination unit 103 for each of the RCLKs.

As shown in FIG. 16, OCLK determination block 205 is provided with three each of the sampling units (107a–107c), the DUM-SGNL determination units (118a–118c) and the FIFO buffers (108a–108c), and with one OCLK determination unit 110.

Sampling units 107a–107c respectively sample signals carried by the signal lines selected by selectors 104a–104c.

FIFO buffers 108a–108c are n-line buffers that respectively accumulate signals sampled by sampling units 107a–107c.

As shown in FIG. 17, output control unit 113 reads the signals from each of FIFO buffers 108a–108c, and sends the read signals to P/S conversion unit 115. At this time, the signals read from FIFO buffers 108a–108c are dispersed over N signal lines, according to the number of selected signal lines (N) and the number of observatory output terminals (M), so that the signals will be dispersed equally from the observatory output terminals. Specifically, the N number of signal lines is divided by the number of observatory output terminals (M), and the signals are sent to P/S conversion unit 115 after being dispersed equally over N/M number of signal line groups.

In the present embodiment, CYCB-SGNL generation unit 117, DUM-SGNL determination unit 118 and a clock boundary signal (CLKB-SGNL) generation unit 120 are provided in output control unit 113.

Finally, P/S conversion unit 115 converts the signals to serial form. Specifically, the signals carried by the N/M number of signal line groups are output sequentially to the M number of observatory output terminals at the corrected OCLK. Thus, by modifying the structure of OCLK determination block 105 in signal output device 100 described in embodiment 1, signal output device 200 is able to sequentially output the signals of signal line groups operating at a plurality (3 max.) of RCLKs.

In the case of signal groups operating at a plurality of RCLKs being selected, OCLK determination unit 110 determines the OCLK based on the fastest of the RCLKs and the number of all selected signal lines, and output control unit 113 acquires the signals from each of FIFO buffers 108a–108c at the respective RCLKs and sequentially outputs the acquired signals at the determined OCLK.

2. SPECIFIC EXAMPLE

Signal output in the case of there being four observatory output terminals in total, as well as eight selected signal lines SA0–SA7 operating at a 200 MHz RCLK, six selected signal lines SB0–SB5 operating at a 150 MHz RCLK, and three selected signal lines SC0–SC2 operating at a 100 MHz RCLK is described here as a specific example.

Figure 19:
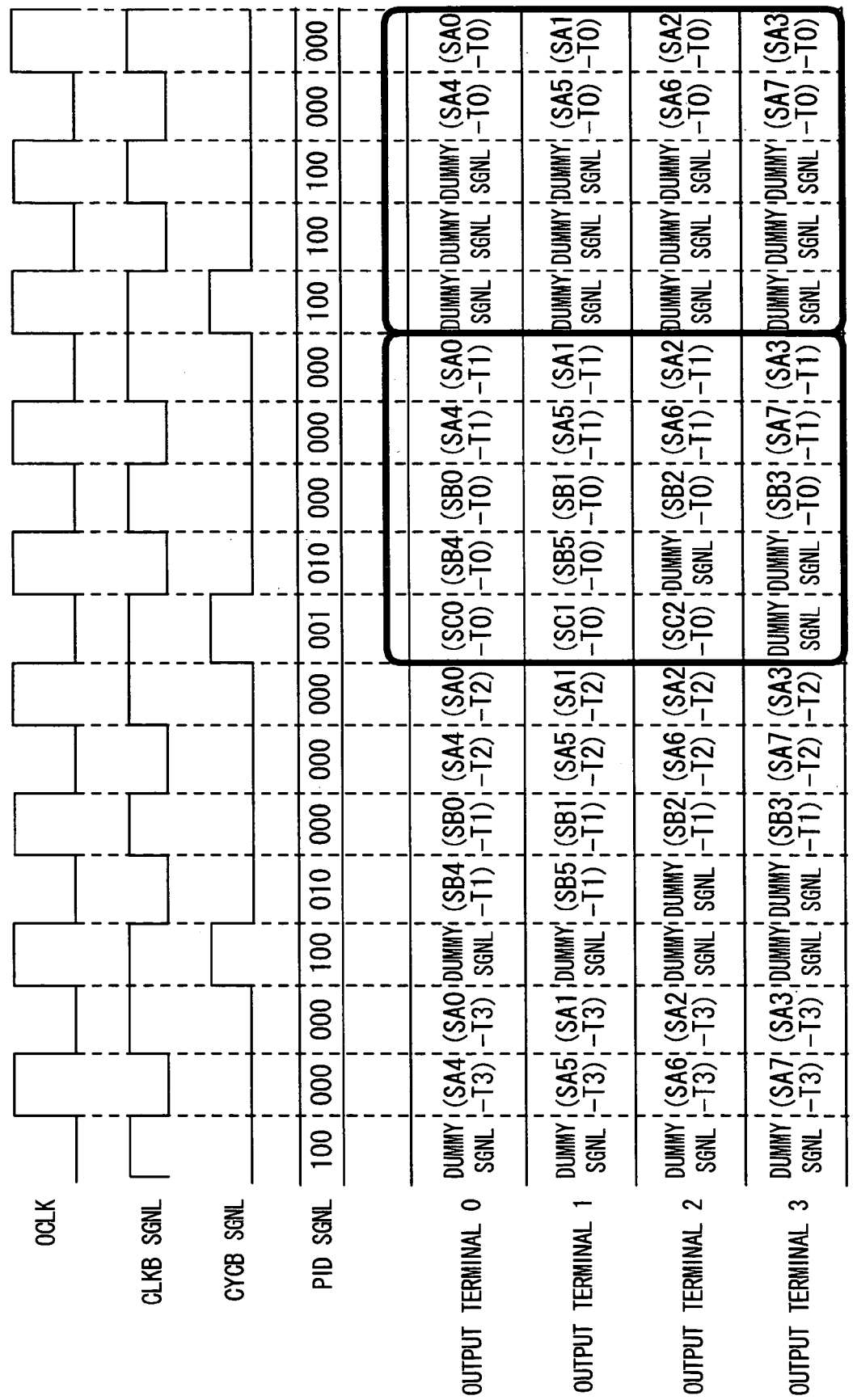
FIG. 19 is a schematic diagram of the signal output operation performed by signal output device 200.

FIGS. 18 and 19 are schematic diagrams showing the signal flow when signal output device 200 performs a signal output control.

Firstly signal line group A (SA0–SA7), signal line group B (SB0–SB5), and signal line group C (SC0–SC2) are selected as signal lines for observation, as shown on the left side of FIG. 18.

Once selectors 104a–104c have selected the 17 signal lines of signal line groups A to C, sampling units 107a–107c corresponding respectively to signal line groups A to C sample the signals, and the sampled signals are accumulated in FIFO buffers 108a–108c for each of the signal groups as shown on the right side of FIG. 18.

That is, sampling unit 107a samples signals SA0–SA7 of signal line group A and FIFO buffer 108a accumulates these signals, sampling unit 107b samples signals SB0–SB5 of signal line group B and FIFO buffer 108b accumulates these signals, and sampling unit 107c samples signals SC0–SC2 of signal line group C, and FIFO buffer 108c accumulates these signals.

At the same time, DUM-SGNL determination units 118a–118c calculate the number of dummy signals to be appended to the end when outputting the signals of the signal groups, based on number of signal lines of each of signal line groups A to C selected by selectors 104a–104c and the number of observatory output terminals stored by storage unit 109.

Specifically, DUM-SGNL determination unit 118b determines the number of dummy signals pertaining to signal group B to be 2, from 6 (no. of signal lines of signal group B)/4(no. of observatory output terminals)=1 remainder 2. Likewise, DUM-SGNL determination unit 118c determines the number of dummy signals pertaining to signal group C to be 1, from 3 (no. of signal lines of signal group C)/4(no. of observatory output terminals)=1 remainder –1.

Next, OCLK determination unit 110 determines the optimum OCLK based on fastest RCLK of signal groups A to C (i.e. RCLK of signal group A), the number of all signal lines of signal groups A to C, the number of observatory output terminals stored by storage unit 109, and the number of dummy signals determined by DUM-SGNL determination units 118a–118c. Specifically, OCLK determination unit 110 determines the smallest frequency f (i.e. 1000 MHz) satisfying the expression $(17+3)*200 \leq 4*f$ as the OCLK, where 17 is the number of all signal lines, 3 is the total number of dummy signals, 200 is the RCLK (MHz) of signal group A, and 4 is the number of observatory output terminals. Output control unit 113 then reads the signals of signal line groups A to C accumulated in FIFO buffers 108a–108c, and sends the read signals sequentially to P/S conversion unit 115 starting with the signals pertaining to signal group A, after appending the determined number of dummy signals to the end of the signals. At this time, output control unit 113 sends the read signals to P/S conversion unit 115 in units of the number of observatory output terminals (i.e. 4) so that the signals will be dispersed from the observatory output terminals. Specifically, the signals are sent four at a time to P/S conversion unit 115 in the order SA0–SA3, SA4–SA7, SB0–SB3, SB4–SB5+group B dummy signals, and SC0–SC2+group C dummy signal.

Finally, P/S conversion unit 115 outputs the signals input four at a time sequentially via the output terminals at 1000 MHz (i.e. at 1/1000 sec cycles) so as to be dispersed in order over observatory output terminals 0 to 4.

Referring to FIGS. 18 and 19, signal groups A, B and C are respectively 200 MHz, 150 MHz and 100 MHz, and the respective cycles are 1/200 sec, 1/150 sec and 1/100 sec. In comparison, one cycle of the RCLK is 1/200 sec. In other words, with signal groups B and C the signals are acquired at a slower speed than the RCLK, causing a delay. As a result, there are times when signals relating to signal groups B and C cannot be output on every cycle of the 200 MHz RCLK. Strictly speaking, there is enough for signals to be output every two out of three cycles in relation to signal group B, and every one out of two cycles in relation to signal group C. Cycles in which signals will not be output are padded using dummy signals.

Note, as shown in FIG. 19, that in output control unit 113, CYCB determination unit 116 determines that the boundary between periods in which signals sampled on every RCLK cycle are output appears every five cycles, based on 17 (no. of all signal lines of signal groups A to C)/4(no. of observatory output terminals)=4 remainder 1 as described in embodiment 2, and based on this CYCB-SGNL generation unit 117 outputs a CYCB signal every 5 OCLK (1000 MHz) cycles via the CYCB signal output terminal.

Also, output control unit 113 outputs PID signals via the PID output terminal that show the number of dummy signals on every OCLK cycle and identify the observatory output terminals via which dummy signals are output, as described in embodiment 3. In the FIG. 19 example, PID signals are expressed by three-bit values. The PID signal in respective clocks is set to a "001" flag if one dummy signal is included and a "100" flag if five dummy signals are included, while being kept at "000" if no dummy signals are included.

Furthermore, CLKB-SGNL generation unit 120 determines the boundary where signal groups output per number of cycles change when outputting signals at the OCLK, based on the number of signal lines of each of signal groups A to C and the number of observatory output terminals, and outputs CLKB signals showing this boundary via the CLKB-SGNL output terminal. Specifically, in relation to signal group A, this boundary is determined to be every two cycles by calculating 8 (no. of signal lines)/4(no. of observatory output terminals)=2. Likewise, this boundary is determined to be every two cycles in relation to signal group B by rounding up 5/4=1 remainder 2, while the boundary is determined to be every one cycle in relation to signal group C from 3/4=1 remainder −1.

As a result, the user knows that in the case of signals being output sequentially starting from signal group A, the boundaries are defined by the signals of signal group A being output in the first two cycles, the signals of signal group B being output in the next two cycles, and the signals of signal group C being output in the following one cycle.

Thus, in the present embodiment, a plurality of signals operating at different RCLKs are input in parallel as shown in FIG. 18, and signals sampled on every RCLK cycle are output in serial form at an OCLK that depends on the number of observatory output terminals as shown in FIG. 19.

Controlling signal output in this way means that even if a plurality of signal lines operating at different RCLKs are chosen for sequential observation, signals carried by all the signal lines can be observed in real time given that signals sampled on one cycle of the respective RCLKs can be output within a period equivalent to the one cycle.

Supplement (1) While embodiments 1 to 3 are described using an example in which selector 104 selects either nine or six signal lines as target signals, the present invention is not limited to this. The user may appropriately select the number of signal lines as target signals for observation.

(2) While embodiments 1 to 4 are described using an example in which there were either three or four observatory output terminals, the present invention is not limited this. The number of observatory output terminals may be adjusted depending on the number of output terminals in the IC package in which the signal output device is implemented.

(3) While embodiment 4 is described using an example in which the signal output device is provided with three each of the signal determination units (103a–103c), the selectors (104a–104c), the sampling units (107a–107c), the DUMSGNL determination units (118a–118c) and the FIFO buffers (108a–108c), so at to perform output controls on signals carried by signal line groups operating at a maximum of three different reference clocks, the present invention is not limited to this. The number of respective elements may be appropriately determined depending on the number of reference clocks of signal lines that the user wants to observe in real time.

(4) While output control unit 113 in embodiments 1 to 4 outputs signals read from FIFO buffer 108 according to the number of signal lines in the signal output device and the number of observatory output terminals so that the signals will be dispersed equally from the observatory output terminals, the present invention is not limited to this, with a number of variations being possible. For example, instead of output control unit 113 controlling the output, signals may be accumulated in FIFO buffer 108 after first being dispersed according to the number of signal lines selected for observation and the number of observatory output terminals when selector 104 has selected signal lines.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A signal output device comprising:
a first selection unit operable to select a plurality of signal lines from a signal line group;
a second selection unit operable to select a reference clock of signals carried by the selected signal lines;
a determination unit operable to determine an output clock based on the reference clock and the number of selected signal lines; and
an output control unit operable to sample the signals carried by the selected signal lines on every cycle of the reference clock, and to sequentially output the sampled signals on every cycle of the output clock.

2. The signal output device of claim 1, being implemented in an IC package that includes the signal line group, which connects a plurality of circuits, and one or more observatory output terminals via which the sampled signals are output for observation, wherein
the determination unit determines the output clock based further on the number of observatory output terminals, and
the output control unit outputs the sampled signals via the one or more observatory output terminals on every cycle of the output clock so as to be dispersed over the one or more observatory output terminals.

3. The signal output device of claim 1, wherein the determination unit determines the output clock so that signals sampled on one cycle of the reference clock are shaped to be output within a period equivalent to the one cycle.

4. The signal output device of claim 2, wherein the determination unit determines a frequency f satisfying an expression $N*F \leq M*f$ as the output clock, where N is the number of selected signal lines, F is the reference clock, and M is the number of observatory output terminals.

5. The signal output device of claim 4 further comprising an output unit operable, when signals are output at the output clock, to generate a cycle boundary signal showing a boundary between periods in which the output control unit outputs signals sampled on one cycle of the reference clock and signals sampled on the next cycle, and to output the cycle boundary signal via an output terminal other than the one or more observatory output terminals.

6. The signal output device of claim 4 further comprising an output unit operable, when signals are output at the output clock, to perform padding by generating a dummy signal and outputting the dummy signal to any observatory output terminal via which a signal will not be output during a period in which the output control unit outputs signals sampled on one cycle of the reference clock, and to output via an output terminal other than the one or more observatory output terminals padding ID signals that show the number of dummy signals output on every cycle of the output clock and identify observatory output terminals via which dummy signals are output.

7. The signal output device of claim 1, wherein
the first selection unit selects a plurality of signal lines carrying signals operating at different reference clocks from the signal line group,
the second selection unit selects the different reference clocks of the signals carried by the selected signal lines,
the determination unit determines the output clock based on the fastest of the reference clocks and the number of selected signal lines, and the output control unit samples the signals carried by the selected signal lines at the respective reference clocks, and sequentially outputs the sampled signals on every cycle of the output clock.

8. The signal output device of claim 7 further comprising an output unit operable, when signals are output at the output clock, to generate a clock boundary signal showing a boundary between cycle periods in which the signals sampled at the respective reference clocks are output, and to output the clock boundary signal via an output terminal other than the one or more observatory output terminals.

9. The signal output device of claim 7 further comprising an output unit operable, when signals are output at the output clock, to perform padding by generating a dummy signal and outputting the dummy signal to any observatory output terminal via which a signal will not be output during a period in which the output control unit outputs signals sampled at one of the plurality of reference clocks, and to output via an output terminal other than the one or more observatory output terminals padding ID signals that show the number of dummy signals output on every cycle of the output clock and identify observatory output terminals via which dummy signals are output.

10. A signal output method comprising the steps of:
selecting a plurality of signal lines from a signal line group;
selecting a reference clock of signals carried by the selected signal lines;
determining an output clock based on the reference clock and the number of selected signal lines; and
sampling the signals carried by the selected signal lines at the reference clock, and sequentially outputting the sampled signals on every cycle of the output clock.

* * * * *